(12) United States Patent
Parekh

(10) Patent No.: US 11,929,323 B2
(45) Date of Patent: Mar. 12, 2024

(54) METHODS OF FORMING A MICROELECTRONIC DEVICE

(71) Applicant: Micron Technology, Inc., Boise, ID (US)

(72) Inventor: Kunal R. Parekh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 18/175,398

(22) Filed: Feb. 27, 2023

(65) Prior Publication Data

US 2023/0207454 A1 Jun. 29, 2023

Related U.S. Application Data

(62) Division of application No. 16/905,698, filed on Jun. 18, 2020, now Pat. No. 11,699,652.

(51) Int. Cl.
*H01L 23/522* (2006.01)
*G11C 7/18* (2006.01)
(Continued)

(52) U.S. Cl.
CPC ............ *H01L 23/5226* (2013.01); *G11C 7/18* (2013.01); *H01L 23/5283* (2013.01);
(Continued)

(58) Field of Classification Search
CPC . H01L 23/5226; H01L 23/5283; H01L 24/05; H01L 25/18; H01L 2924/1431;
(Continued)

(56) References Cited

U.S. PATENT DOCUMENTS

| 4,925,809 A | 5/1990 | Yoshiharu et al. |
| 6,165,247 A | 12/2000 | Kodas et al. |

(Continued)

FOREIGN PATENT DOCUMENTS

| CN | 107768376 A | 3/2018 |
| CN | 107887395 A | 4/2018 |

(Continued)

OTHER PUBLICATIONS

Choe et al., YMTC is China's First Mass Producer of 3D NAND Flash Memory Chips, https://www.techinsights.com/blog/ymtc-chinas-first-mass-producer-3d-nand-flash-memory-chips, (Mar. 12, 2020), 3 pages.

(Continued)

*Primary Examiner* — Thanh T Nguyen
(74) *Attorney, Agent, or Firm* — TraskBritt

(57) ABSTRACT

A method of forming a microelectronic device comprises forming a microelectronic device structure comprising a base structure, a doped semiconductive material overlying the base structure, a stack structure overlying the doped semiconductive material, cell pillar structures vertically extending through the stack structure and the doped semiconductive material and into the base structure, and digit line structures vertically overlying the stack structure. An additional microelectronic device structure comprising control logic devices is formed. The microelectronic device structure is attached to the additional microelectronic device structure to form a microelectronic device structure assembly. The base structure and portions of the cell pillar structures vertically extending into the base structure are removed to expose the doped semiconductive material. The doped semiconductive material is then patterned to form at least one source structure over the stack structure and (Continued)

coupled to the cell pillar structures. Microelectronic devices and electronic systems are also described.

20 Claims, 15 Drawing Sheets

(51) Int. Cl.
*H01L 23/00* (2006.01)
*H01L 23/528* (2006.01)
*H01L 25/18* (2023.01)
*H10B 41/27* (2023.01)
*H10B 41/35* (2023.01)

(52) U.S. Cl.
CPC .............. *H01L 24/05* (2013.01); *H01L 25/18* (2013.01); *H10B 41/27* (2023.02); *H10B 41/35* (2023.02); *H01L 2924/1431* (2013.01); *H01L 2924/1443* (2013.01)

(58) Field of Classification Search
CPC .............. H01L 2924/1443; H01L 24/80; H01L 2224/05548; H01L 2224/05624; H01L 2224/05638; H01L 2224/05647; H01L 2224/05686; H01L 2224/09181; H01L 2224/80379; H01L 2224/80895; H01L 2224/80896; H01L 2224/9202; H01L 25/0657; H01L 2225/06541; H01L 25/50; H01L 2224/08145; H01L 2225/06524; G11C 7/18; H10B 41/27; H10B 41/35; H10B 43/40; H10B 41/41
See application file for complete search history.

(56) References Cited

U.S. PATENT DOCUMENTS

| | | | |
|---|---|---|---|
| 7,372,091 B2 | 5/2008 | Leslie | |
| 7,897,485 B2 | 3/2011 | Parekh | |
| 8,042,082 B2 | 10/2011 | Solomon | |
| 8,958,228 B2 | 2/2015 | Samachisa et al. | |
| 9,196,753 B2 | 11/2015 | Ramaswamy et al. | |
| 9,397,145 B1 | 7/2016 | Sills et al. | |
| 9,449,652 B2 | 9/2016 | Juengling | |
| 9,515,083 B2 | 12/2016 | Lee et al. | |
| 9,530,790 B1 | 12/2016 | Lu et al. | |
| 9,553,263 B1 | 1/2017 | Petz et al. | |
| 9,590,012 B2 | 3/2017 | Lee et al. | |
| 9,653,617 B2 | 5/2017 | Zhou et al. | |
| 9,922,716 B2 | 3/2018 | Hsiung et al. | |
| 10,141,330 B1 | 11/2018 | Lindsay et al. | |
| 10,283,703 B2 | 5/2019 | Pellizzer et al. | |
| 10,381,362 B1 | 8/2019 | Cui et al. | |
| 10,665,580 B1* | 5/2020 | Hosoda ................ | H10B 43/10 |
| 10,847,220 B2 | 11/2020 | Castro | |
| 11,282,815 B2 | 3/2022 | Parekh et al. | |
| 2003/0113669 A1 | 6/2003 | Cheng et al. | |
| 2003/0151083 A1 | 8/2003 | Matsui et al. | |
| 2005/0265076 A1 | 12/2005 | Forbes | |
| 2006/0076690 A1 | 4/2006 | Khandros et al. | |
| 2007/0288702 A1 | 12/2007 | Roohparvar | |
| 2008/0019165 A1 | 1/2008 | Lin et al. | |
| 2009/0168482 A1 | 7/2009 | Park et al. | |
| 2011/0159645 A1 | 6/2011 | Pekny | |
| 2011/0309431 A1 | 12/2011 | Kidoh et al. | |
| 2012/0047321 A1 | 2/2012 | Yoon et al. | |
| 2012/0161094 A1 | 6/2012 | Huo et al. | |
| 2012/0181602 A1 | 7/2012 | Fukuzumi et al. | |
| 2012/0224426 A1 | 9/2012 | Nam et al. | |
| 2013/0126622 A1 | 5/2013 | Finn | |
| 2013/0130468 A1 | 5/2013 | Higashitani et al. | |
| 2014/0001583 A1 | 1/2014 | Teh et al. | |
| 2014/0061750 A1 | 3/2014 | Kwon et al. | |
| 2014/0063938 A1 | 3/2014 | Oh et al. | |
| 2014/0124726 A1 | 5/2014 | Oh | |
| 2014/0175637 A1 | 6/2014 | Stuber et al. | |
| 2014/0204675 A1 | 7/2014 | Cho et al. | |
| 2015/0091180 A1 | 4/2015 | Ong et al. | |
| 2015/0243708 A1 | 8/2015 | Ravasio et al. | |
| 2015/0278675 A1 | 10/2015 | Finn et al. | |
| 2016/0049201 A1 | 2/2016 | Lue et al. | |
| 2016/0079164 A1 | 3/2016 | Fukuzumi et al. | |
| 2016/0104715 A1 | 4/2016 | Pachamuthu et al. | |
| 2016/0268304 A1 | 9/2016 | Ikeda et al. | |
| 2016/0343727 A1 | 11/2016 | Kim et al. | |
| 2017/0025421 A1 | 1/2017 | Sakakibara et al. | |
| 2017/0054036 A1 | 2/2017 | Dorhout et al. | |
| 2017/0092649 A1 | 3/2017 | Takaoka | |
| 2017/0148802 A1 | 5/2017 | Dorhout et al. | |
| 2018/0053768 A1 | 2/2018 | Kim et al. | |
| 2018/0108741 A1 | 4/2018 | Li et al. | |
| 2018/0158689 A1 | 6/2018 | Mumford | |
| 2019/0043836 A1* | 2/2019 | Fastow ............... | H01L 27/0688 |
| 2019/0088493 A1 | 3/2019 | Watanabe et al. | |
| 2019/0096906 A1 | 3/2019 | Lindsay et al. | |
| 2019/0206861 A1 | 7/2019 | Beigel et al. | |
| 2019/0221557 A1 | 7/2019 | Kim et al. | |
| 2019/0229089 A1 | 7/2019 | Zhou et al. | |
| 2019/0355786 A1 | 11/2019 | Iguchi | |
| 2020/0006380 A1 | 1/2020 | Van et al. | |
| 2020/0013792 A1 | 1/2020 | Parekh et al. | |
| 2020/0013798 A1 | 1/2020 | Parekh | |
| 2020/0066745 A1 | 2/2020 | Yu et al. | |
| 2020/0083245 A1 | 3/2020 | Fayrushin et al. | |
| 2020/0098776 A1 | 3/2020 | Sugisaki | |
| 2020/0135541 A1 | 4/2020 | Wu et al. | |
| 2020/0159133 A1 | 5/2020 | Yan et al. | |
| 2020/0161295 A1 | 5/2020 | Sills et al. | |
| 2020/0185406 A1 | 6/2020 | Li et al. | |
| 2020/0219815 A1 | 7/2020 | Elsherbini et al. | |
| 2020/0227397 A1* | 7/2020 | Yada ..................... | H10B 43/40 |
| 2020/0258816 A1* | 8/2020 | Okina ................... | H10B 43/40 |
| 2020/0258876 A1 | 8/2020 | Hosoda et al. | |
| 2020/0258904 A1 | 8/2020 | Kai et al. | |
| 2020/0273840 A1 | 8/2020 | Elsherbini et al. | |
| 2021/0074711 A1 | 3/2021 | Suzuki et al. | |
| 2021/0082939 A1 | 3/2021 | Matsuda | |
| 2021/0134778 A1 | 5/2021 | Huang et al. | |
| 2021/0296316 A1 | 9/2021 | Zhu | |
| 2021/0343690 A1 | 11/2021 | Salmon | |
| 2021/0398847 A1 | 12/2021 | Parekh | |
| 2022/0028830 A1 | 1/2022 | Kirby | |

FOREIGN PATENT DOCUMENTS

| | | |
|---|---|---|
| CN | 108447865 A | 8/2018 |
| CN | 111247636 A | 6/2020 |
| JP | 2002-103299 A | 4/2002 |
| KR | 10-2009-0034570 A | 4/2009 |
| KR | 10-2014-0117062 A | 10/2014 |
| KR | 10-2015-0085155 A | 7/2015 |
| KR | 10-2020-0008606 A | 1/2020 |
| KR | 10-2020-0037444 A | 4/2020 |
| TW | 201511319 A | 3/2015 |
| TW | 201826556 A | 7/2018 |
| TW | 201941407 B | 10/2019 |
| TW | 201946057 A | 12/2019 |
| TW | 202008568 B | 2/2020 |
| WO | 2008/063251 A2 | 5/2008 |

OTHER PUBLICATIONS

International Search Report for Application No. PCT/US2021/033361, dated Sep. 7, 2021, 4 pages.
Li et al., Skybridge-3D-CMOS: A Fine-Grained 3D Cmos Integrated Circuity Technology, IEEE Transactions on Nanotechnology, vol. 16, No. 4, Jul. 2017, pp. 639-652.
Micron, Introducing 2nd Generation Micron Mobile TLC 3D NAND, Industry-Leading Storage Solutions for Flagship Smartphones, (2018), 9 pages.

(56) References Cited

OTHER PUBLICATIONS

Taiwanese Search Report and Office Action from Taiwanese Application No. 110119650, dated Apr. 6, 2022, 25 pages with English translation.
Written Opinion of the International Searching Authority for Application No. PCT/US2021/033361, dated Sep. 7, 2021, 4 pages.
YMTC, About Xtacking, http://www.ymtc.com, visited Apr. 20, 2020, 3 pages.

* cited by examiner

METHODS OF FORMING A MICROELECTRONIC DEVICE

CROSS-REFERENCE TO RELATED APPLICATIONS

This application is a divisional of U.S. patent application Ser No. 16/905,698, filed Jun. 18, 2020, now U.S. Pat. No. 11,699,652, issued Jul. 11, 2023, which is related to U.S. patent application Ser. No. 16/905,385, filed Jun, 18, 2020, now U.S. Pat. No. 11,563,018, issued Jan. 24, 2023, listing Kunal R. Parekh as inventor, for "MICROELECTRONIC DEVICES, AND RELATED METHODS, MEMORY DEVICES, AND ELECTRONIC SYSTEMS." This application is also related to U.S. patent application Ser. No. 16/905,452, filed Jun. 18, 2020, now U.S. Pat. No. 11,705,367, issued Jul. 18, 2023, listing Kunal R. Parekh as inventor, for "METHODS OF FORMING MICROELECTRONIC DEVICES, AND RELATED MICROELECTRONIC DEVICES, MEMORY DEVICES, ELECTRONIC SYSTEMS, AND ADDITIONAL METHODS." This application is also related to U.S. patent application Ser. No. 16/905,747, filed Jun. 18, 2020, now U.S. Pat. No. 11,557,569, issued Jan. 17, 2023, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,763, filed Jun. 18, 2020, now U.S. Pat. No. 11,335,602, issued May 17, 2022, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,734, filed Jun. 18, 2020, now U.S. Pat. No. 11,380,669, issued Jul. 5, 2022, listing Kunal R. Parekh as inventor, for "METHODS OF FORMING MICROELECTRONIC DEVICES, AND RELATED BASE STRUCTURES FOR MICROELECTRONIC DEVICES." The disclosure of each of the foregoing documents is hereby incorporated herein in its entirety by reference.

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) on the memoir cells of the memory device. An assembly of the control logic devices may be provided in electrical communication with the memory cells of the memory array by way of routing and interconnect structures. However, processing conditions(e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the memory device,

DETAILED DESCRIPTION

Figure 1A:
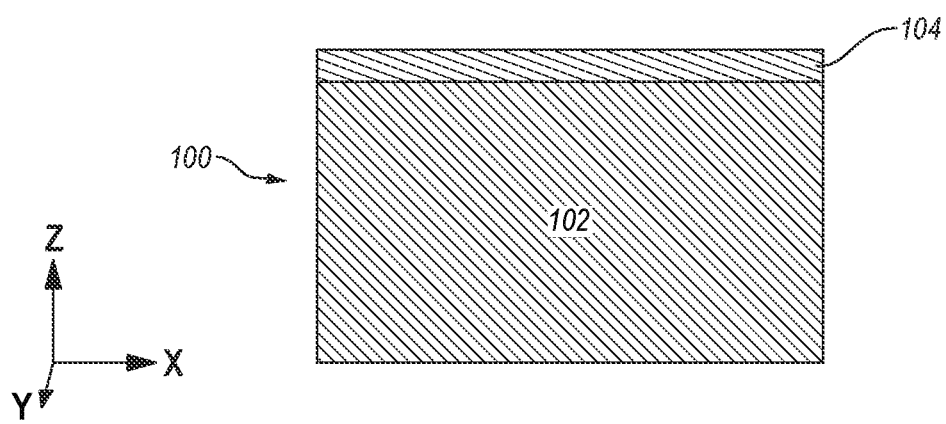
FIGS. 1A through 1F are simplified, partial cross-sectional views illustrating a method of forming a microelectronic device structure, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe— and Ni-based alloy, a Co— and Ni-based alloy, an Fe— and Co-based alloy, a Co— and Ni— and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization, or other known methods.

FIGS. 1A through 1F are simplified partial cross-sectional views illustrating embodiments of a method of forming a microelectronic device structure (e.g., a memory device structure) for a microelectronic device (e.g., a memory device, such as a 3D NAND Flash memory device). With the description as provided below, it will be readily apparent to one of ordinary skill in the art that the methods described herein may be used in various applications. In other words, the methods of the disclosure may be used whenever it is desired to form a microelectronic device.

Referring to FIG. 1A, a microelectronic device structure 100 may be formed to include a base structure 102, and a doped semiconductive material 104 in, on, or over the base structure 102. As shown in FIG. 1A, in some embodiments, the doped semiconductive material 104 is formed on an upper surface of the base structure 102. In additional embodiments, at least one material (e.g., at least one insulative material) is formed between the base structure 102 and the doped semiconductive material 104. As a non-limiting example, a dielectric oxide material (e.g., $SiO_x$, such as silicon dioxide ($SiO_2$)) may be formed between (e.g., vertically between) the base structure 102 and the doped semiconductive material 104. In further embodiments, the doped semiconductive material 104 is also formed on or over one or more additional surfaces of the base structure 102. As a non-limiting example, a first portion the doped semiconductive material 104 may be formed on or over the upper surface of the base structure 102, and a second portion of the doped semiconductive material 104 under (e.g., under and in physical contact with) a lower surface of the base structure 102.

The base structure 102 of the microelectronic device structure 100 comprises a base material or construction upon which additional features (e.g., materials, structures, devices) of the microelectronic device structure 100 are formed. The base structure 102 may, for example, be formed of and include one or more of semiconductive material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductive material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha\text{-}Al_2O_3$), and silicon carbide). The base structure 102 may be configured to facilitate safe handling of the microelectronic device structure 100 for subsequent attachment to at least one additional microelectronic device structure, as described in further detail below.

The doped semiconductive material 104 may formed of and include at least one semiconductive material doped with at least one conductive dopant (e.g., at least one n-type dopant, such as one or more of phosphorus (P), arsenic (Ar), antimony (Sb), and bismuth (Bi); at least one p-type dopant, such as one or more of boron (B), aluminum (Al), and gallium (Ga)). In some embodiments, the doped semiconductive material 104 is formed of and includes one or more of a silicon material, such as monocrystalline silicon or polycrystalline silicon; a silicon-germanium material; a germanium material; a gallium arsenide material; a gallium nitride material; and an indium phosphide material. As a non-limiting example, the doped semiconductive material 104 may be formed of and include epitaxial silicon (e.g., monocrystalline silicon formed through epitaxial growth) doped with at least one conductive dopant (e.g., at least one n-type dopant, at least one p-type dopant). As another non-limiting example, the doped semiconductive material 104 may be formed of and include polycrystalline silicon doped with at least one conductive dopant (e.g., at least one n-type dopant, at least one p-type dopant).

Figure 1B:
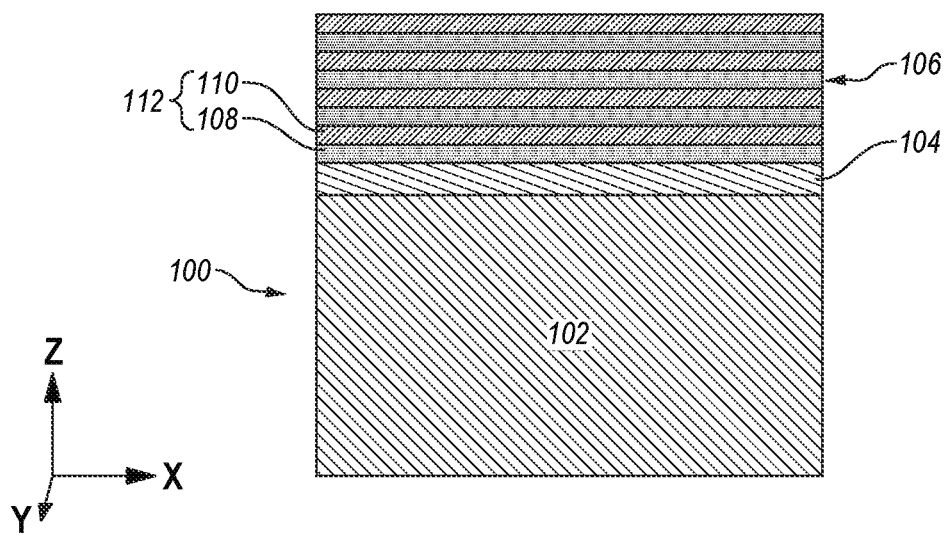

Referring next to FIG. 1B, a preliminary stack structure 106 may be formed on or over the doped semiconductive material 104. As shown in FIG. 1B, the preliminary stack structure 106 includes a vertically alternating (e.g., in the Z-direction) sequence of insulative structures 108 and sacrificial structures 110 arranged in tiers 112. Each of the tiers 112 of the preliminary stack structure 106 may include at least one of the sacrificial structures 110 vertically neighboring at least one of the insulative structures 108. The preliminary stack structure 106 may be formed to include any desired number of the tiers 112, such as greater than or equal to sixteen (16) of the tiers 112, greater than or equal to thirty-two (32) of the tiers 112, greater than or equal to sixty-four (64) of the tiers 112, greater than or equal to one hundred and twenty-eight (128) of the tiers 112, or greater than or equal to two hundred and fifty-six (256) the tiers 112.

The insulative structures 108 of the tiers 112 of the preliminary stack structure 106 may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). Each of the insulative structures 108 may individually be substantially homogeneous, may be or a substantially heterogeneous. As used herein, the term "homogeneous" means amounts of a material do not vary throughout different portions (e.g., different horizontal portions, different vertical portions) of a structure. Conversely, as used herein, the term "heterogeneous" means amounts of a material vary throughout different portions of a structure. In some embodiments, each of the insulative structures 108 is substantially homogeneous. In further embodiments, at least one of the insulative structures 108 is substantially heterogeneous. One or more of the insulative structures 108 may, for example, be formed of and include a stack (e.g., laminate) of at least two different insulative materials (e.g., at least two different dielectric materials). In some embodiments, each of the insulative structures 108 is formed of and includes a dielectric oxide material, such as $SiO_x$ (e.g., $SiO_2$). The insulative structures 108 may each be substantially planar, and may each individually exhibit a desired thickness (e.g., vertical height in the Z-direction). In addition, each of the insulative structures 108 may be substantially the same (e.g., have substantially the same material composition, material distribution, size, and shape) as one another, or at least one of the insulative structures 108 may be different (e.g., have one or more of a different material composition, a different material distribution, a different size, and a different shape) than at least one other of the insulative structures 108. In some embodiments, each of the insulative structures 108 is substantially the same as each other of the insulative structures 108.

The sacrificial structures 110 of the tiers 112 of the preliminary stack structure 106 may be formed of and include at least one material (e.g., at least one insulative material) that may be selectively removed relative to the insulative material of the insulative structures 108. A material composition of the sacrificial structures 110 is different than a material composition of the insulative structures 108. The sacrificial structures 110 may be selectively etchable relative to the insulative structures 108 during common (e.g., collective, mutual) exposure to a first etchant, and the insulative structures 108 may be selectively etchable to the sacrificial structures 110 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. As a non-limiting example, the sacrificial structures 110 may be formed of and include an additional insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the sacrificial structures 110 is formed of and includes a dielectric nitride material, such as $SiN_y$ (e.g., $Si_3N_4$). Each of the sacrificial structures 110 may individually be substantially homogeneous or substantially heterogeneous. In some embodiments, each of the sacrificial structures 110 of the preliminary stack structure 106 is substantially homogeneous. In additional embodiments, at least one of the sacrificial structures 110 of the preliminary stack structure 106 is substantially heterogeneous. The sacrificial structures 110 may each be substantially planar, and may each individually exhibit a desired thickness (e.g., vertical height in the Z-direction). In addition, each of the sacrificial structures 110 may be substantially the same (e.g., exhibit substantially the same material composition, material distribution, size, and shape) as one another, or at least one of the sacrificial structures 110 may be different (e.g., exhibit one or more of a different material composition, a different material distribution, a different size, and a different shape) than at least one other of the sacrificial structures 110. In some embodiments, each of the sacrificial structures 110 is substantially the same as each other of the sacrificial structures 110.

Figure 1C:
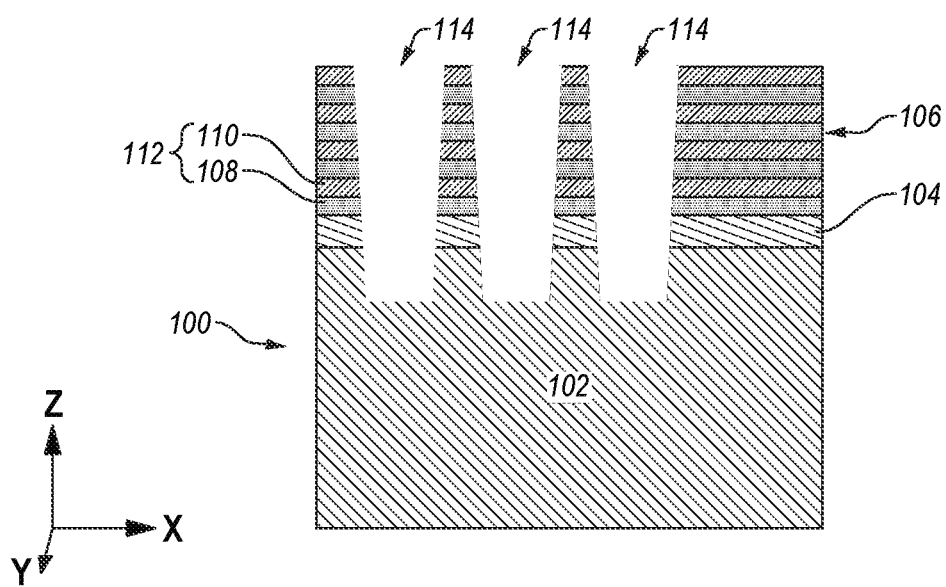

Referring next to FIG. 1C, openings 114 (e.g., apertures, vias) may be formed to vertically extend (e.g., in the Z-direction) through each of the preliminary stack structure 106 and the doped semiconductive material 104, and into the base structure 102. As shown FIG. 1C, the openings 114 may each individually vertically extend from an uppermost surface of the preliminary stack structure 106 to a vertical position between an uppermost surface of the base structure 102 and a lowermost surface of the base structure 102. The openings 114 may be used to form cell pillar structures employed to form vertically extending strings of memory cells, as described in further detail below.

The openings 114 may each individually be formed to exhibit a geometric configuration (e.g., dimensions, shapes) and spacing. The geometric configurations and spacing of the openings 114 may be selected at least partially based on the configurations and positions of other features of the microelectronic device structure 100. For example, the openings 114 may be sized, shape, and spaced to facilitate desired geometric configurations and spacing of additional features (e.g., additional structures, additional materials) to subsequently be formed therein. In some embodiments, each opening 114 is formed to have a substantially circular horizontal cross-sectional shape. In additional embodiments, one or more (e.g., each) of the openings 114 is formed to have a different (e.g., non-circular) horizontal cross-sectional shape, such as one or more of a tetragonal horizontal cross-sectional shape (e.g., a square horizontal cross-sectional shape), an ovular horizontal cross-sectional shape, an elliptical horizontal cross-sectional shape, a triangular horizontal cross-sectional shape, or another horizontal cross-sectional shape. Each of the openings 114 may be formed to exhibit substantially the same geometric configuration (e.g., the same dimensions and the same shape) and horizontal spacing (e.g., in the X-direction, in the Y-direction) as each other of the openings 114, or at least some of the openings 114 may be formed to exhibit a different geometric configuration (e.g., one or more different dimensions, a different shape) and/or different horizontal spacing than at least some other of the openings 114.

Figure 1D:
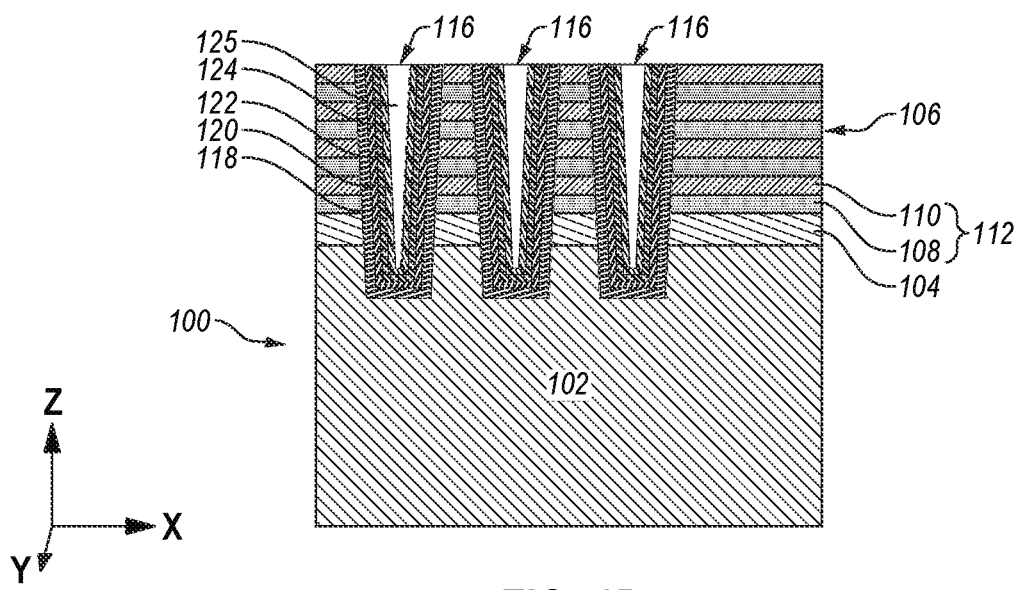

Referring next to FIG. 1D, cell pillar structures 116 may be formed within the openings 114 (FIG. 1C). The cell pillar structures 116 may at least partially (e.g., substantially) fill the openings 114 (FIG. 1C). The cell pillar structures 116 may vertically extend (e.g., in the Z-direction) through each of the preliminary stack structure 106 and the doped semiconductive material 104, and into the base structure 102. As shown FIG. 1D, the cell pillar structures 116 may each individually vertically extend from an uppermost surface of the preliminary stack structure 106 to a vertical position between an uppermost surface of the base structure 102 and a lowermost surface of the base structure 102. Uppermost surfaces of the cell pillar structures 116 may be substantially coplanar with the uppermost surface of the preliminary stack structure 106, and lower surfaces of the cell pillar structures 116 may vertically underlie the uppermost surface of the base structure 102.

The cell pillar structures 116 may each individually be formed of and include a stack of materials facilitating the use of the cell pillar structures 116 to form vertically extending strings of memory cells following subsequent processing acts, as described in further detail below. By way of non-limiting example, each of the cell pillar structures 116 may be formed to include a first dielectric oxide material 118 (e.g., $SiO_x$, such as $SiO_2$; $AlO_x$, such as $Al_2O_3$), a dielectric nitride material 120 (e.g., $SiN_y$, such as $Si_3N_4$), a second oxide dielectric material 122 (e.g., $SiO_x$, such as $SiO_2$), a semiconductive material 124 (e.g., Si, such as polycrystalline Si), and a dielectric fill material 125 (e.g., a dielectric oxide, a dielectric nitride, air). The first dielectric oxide material 118 may be formed on or over surfaces of the microelectronic device structure 100 (e.g., surfaces of the preliminary stack structure 106, the doped semiconductive material 104, and the base structure 102) at boundaries (e.g., horizontally boundaries, lower vertical boundaries) of the openings 114 (FIG. 1C). The dielectric nitride material 120 may be formed on or over surfaces of the first dielectric oxide material 118 within the openings 114 (FIG. 1C). The second oxide dielectric material 122 may be formed on or over surfaces of the dielectric nitride material 120 within the openings 114 (FIG. 1C). The semiconductive material 124 may be formed on or over surfaces of the second oxide dielectric material 122 within the openings 114 (FIG. 1C).

The dielectric fill material 125 may occupy (e.g., fill) central portions of the openings 114 (FIG. 1C) not occupied by other features (e.g., the first dielectric oxide material 118, the dielectric nitride material 120, the second oxide dielectric material 122, the semiconductive material 124) of the cell pillar structures 116.

Figure 1E:
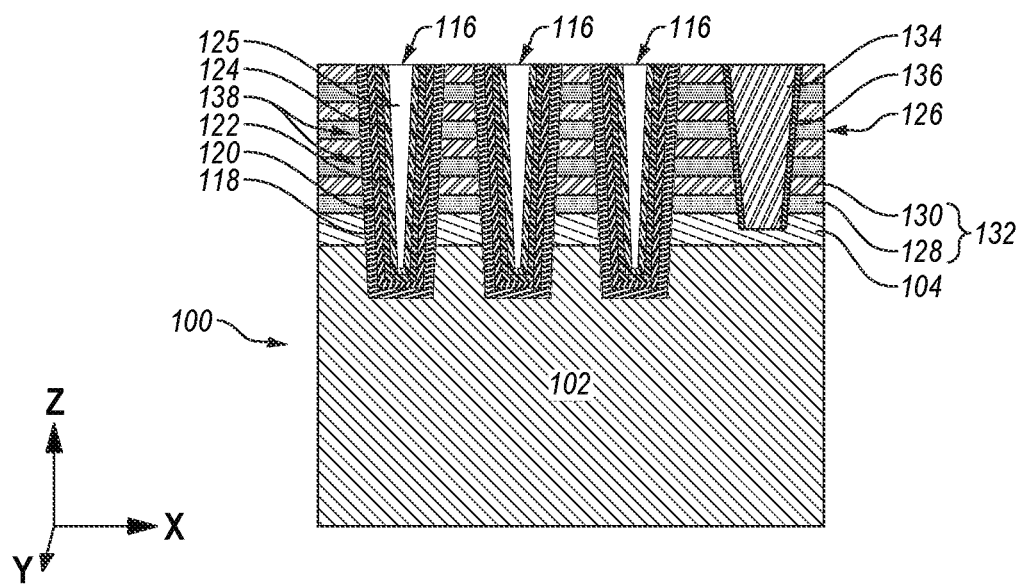

Referring next to FIG. 1E, the microelectronic device structure 100 may be subjected to so called "replacement gate" or "gate last" processing acts to at least partially replace the sacrificial structures 110 (FIG. 1D) of the preliminary stack structure 106 (FIG. 1D) with conductive structures 130 and form a stack structure 126. As shown in FIG. 1E, the stack structure 126 includes a vertically alternating (e.g., in the Z-direction) sequence of additional insulative structures 128 and the conductive structures 130 arranged in tiers 132. The additional insulative structures 128 may correspond to remainders (e.g., remaining portions, unremoved portions) of the insulative structures 108 (FIG. 1D) of the preliminary stack structure 106 (FIG. 1D) following the "replacement gate" processing acts. Each of the tiers 132 of the stack structure 126 includes at least one of the conductive structures 130 vertically neighboring at least one of the additional insulative structures 128. In addition, as shown in FIG. 1E, deep contact structures 134 may be formed to vertically extend through the stack structure 126 and to or into the doped semiconductive material 104. The deep contact structures 134 may be electrically isolated from the conductive structures 130 of the tiers 132 of the stack structure 126 by way of insulative liner structures 136 formed to horizontally intervene between the deep contact structures 134 and the stack structure 126.

The conductive structures 130 of the tiers 132 of the stack structure 126 may be formed of and include conductive material. By way of non-limiting example, the conductive structures 130 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive structures 130 are formed of and include W. Each of the conductive structures 130 may individually be substantially homogeneous, or one or more of the conductive structures 130 may individually be substantially heterogeneous. In some embodiments, each of the conductive structures 130 is formed to be substantially homogeneous. In additional embodiments, each of the conductive structures 130 is formed to be heterogeneous. Each conductive structures 130 may, for example, be formed of and include a stack of at least two different conductive materials.

Still referring to FIG. 1E, one or more liner materials (e.g., insulative liner materials, conductive liner materials) may be formed around the conductive structures 130. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, liner material comprises at least one conductive material employed as a seed material for the formation of the conductive structures 130. In some such embodiments, the liner material comprises titanium nitride. In additional embodiments, the liner material further includes aluminum oxide. As a non-limiting example, aluminum oxide may be formed directly adjacent the additional insulative structures 128, titanium nitride may be formed directly adjacent the aluminum oxide, and tungsten may be formed directly adjacent the titanium nitride. For clarity and ease of understanding the description, the one or more liner materials are not illustrated in FIG. 1E, but it will be understood that the liner material(s) may be disposed around the conductive structures 130.

To form the stack structure 126 through "replacement gate" processing acts, slots (e.g., slits, trenches) may be formed to vertically extend through the preliminary stack structure 106 (FIG. 1D) to form discrete blocks. Thereafter, portions of the sacrificial structures 110 (FIG. 1D) of the preliminary stack structure 106 (FIG. 1D) may be selectively removed (e.g., selectively etched and exhumed) through the slots, and replaced with conductive material to form the conductive structures 130. Some of the conductive structures 130 may function as access line structures (e.g., word line structures) for a microelectronic device (e.g., a memory device, such as a 3D NAND Flash memory device) to subsequently be formed using the microelectronic device structure 100, and other of the conductive structures 130 may function as select gate structures for the subsequently formed microelectronic device. Following the formation of the conductive structures 130 the slots may be filled with at least one dielectric material.

With continued reference to FIG. 1E, intersections of the cell pillar structures 116 and the conductive structures 130 of the tiers 132 of the stack structure 126 may define vertically extending strings of memory cells 138 coupled in series with one another within the stack structure 126. In some embodiments, the memory cells 138 formed at the intersections of the conductive structures 130 and the cell pillar structures 116 within the tiers 132 of the stack structure 126 comprise so-called "MONOS" (metal—oxide—nitride—oxide—semiconductor) memory cells. In additional embodiments, the memory cells 138 comprise so-called "TANOS" (tantalum nitride—aluminum oxide—nitride—oxide—semiconductor) memory cells, or so-called "BETANOS" (band/barrier engineered TANOS) memory cells, each of which are subsets of MONOS memory cells. In further embodiments, the memory cells 138 comprise so-called "floating gate" memory cells including floating gates (e.g., metallic floating gates) as charge storage structures. The floating gates may horizontally intervene between central structures of the cell pillar structures 116 and the conductive structures 130 of the different tiers 132 of the stack structure 126.

The deep contact structures 134 may be configured and positioned to electrically connect one or more features to subsequently be formed over the stack structure 126 with one or more other features (e.g., the doped semiconductive material 104, additional features to subsequently be formed and coupled to the doped semiconductive material 104) underlying the stack structure 126. The deep contact structures 134 may be formed of and include conductive material. In some embodiments, the deep contact structures 134 are formed of and include W. In additional embodiments, the deep contact structures 134 are formed of and include conductively doped polysilicon.

The insulative liner structures 136 continuously extend over and substantially cover side surfaces of the deep contact structures 134. The insulative liner structures 136 may be formed over and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative liner structures 136 is formed of and includes at least one dielectric oxide material (e.g., $SiO_x$, such as $SiO_2$).

Figure 1F:
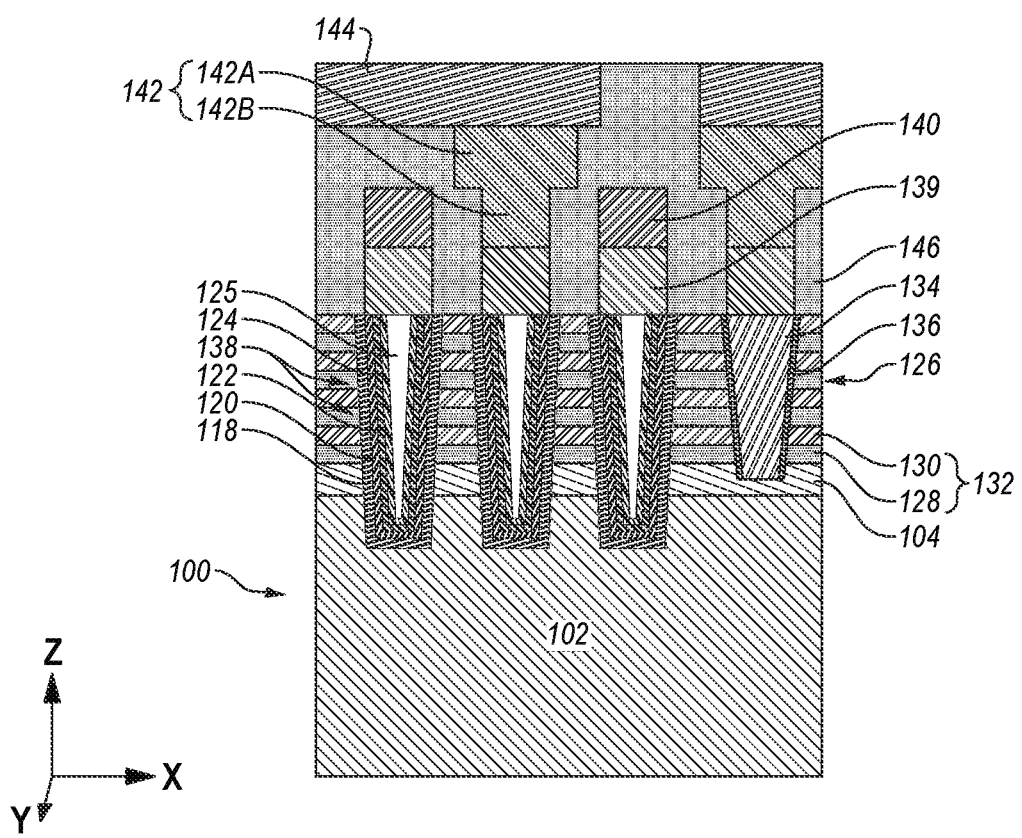

Referring next to FIG. 1F, digit line structures 139 (e.g., data line structures, bit line structures), insulative line structures 140, digit line contact structures 142, bond pads 144, and isolation material 146 may be formed on or over the stack structure 126. The digit line structures 139 may be formed vertically over and in electrical communication with the vertically extending strings of memory cells 138 and the deep contact structures 134. The insulative line structures 140 may be formed on or over the digit line structures 139. The digit line contact structures 142 may vertically extend through the insulative line structures 140, and may contact the digit line structures 139. For each digit line contact structure 142, a first portion 142A thereof may vertically overlie one of the insulative line structures 140, and a second portion 142B thereof may vertically extend through the insulative line structure 140 and contact (e.g., physically contact, electrically contact) one of the digit line structures 139. The bond pads 144 may be formed on or over the digit line contact structures 142. The isolation material 146 may cover and surround of portions of the stack structure 126, the digit line structures 139, the insulative line structures 140, the digit line contact structures 142, and the bond pads 144.

The digit line structures 139 may exhibit horizontally elongate shapes extending in parallel in a first horizontal direction (e.g., the Y-direction). As used herein, the term "parallel" means substantially parallel. The digit line structures 139 may each exhibit substantially the same dimensions (e.g., width in the X-direction, length in a Y-direction, height in the Z-direction), shape, and spacing (e.g., in the X-direction). In additional embodiments, one or more of the digit line structures 139 may exhibit one or more of at least one different dimension (e.g., a different length, a different width, a different height) and a different shape than one or more other of the digit line structures 139, and/or the spacing (e.g., in the X-direction) between at least two horizontally neighboring digit line structures 139 may be different than the spacing between at least two other horizontally neighboring digit line structures 139.

The digit line structures 139 may be formed of and include conductive material. By way of non-limiting example, the digit line structures 139 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the digit line structures 139 are each individually formed of and include W. Each of the digit line structures 139 may individually be substantially homogeneous, or one or more of the digit line structures 139 may individually be substantially heterogeneous. If a digit line structure 139 is heterogeneous, amounts of one or more elements included in the digit line structure 139 may vary stepwise (e.g., change abruptly), or may vary continuously (e.g., change progressively, such as linearly, parabolically) throughout different portions of the digit line structure 139. In some embodiments, each of the digit line structures 139 is substantially homogeneous. In additional embodiments, each of the digit line structures 139 is heterogeneous. Each digit line structures 139 may, for example, be formed of and include a stack of at least two different conductive materials.

The insulative line structures 140 may serve as insulative cap structures (e.g., dielectric cap structures) for the digit line structures 139. The insulative line structures 140 may have horizontally elongate shapes extending in parallel in the first horizontal direction (e.g., the Y-direction). Horizontal dimensions, horizontal pathing, and horizontal spacing of the insulative line structures 140 may be substantially the same and the horizontal dimensions, horizontal pathing, and horizontal spacing of the digit line structures 139.

The insulative line structures 140 may be formed of and include insulative material. By way of non-limiting example, the insulative line structures 140 may each individually be formed of and include a dielectric nitride material, such as $SiN_y$ (e.g., $Si_3N_4$). The insulative line structures 140 may each be substantially homogeneous, or one or more of the insulative line structures 140 may be heterogeneous. If an insulative line structure 140 is heterogeneous, amounts of one or more elements included in the insulative line structure 140 may vary stepwise (e.g., change abruptly), or may vary continuously (e.g., change progressively, such as linearly, parabolically) throughout different portions of the insulative line structure 140. In some embodiments, each of the insulative line structures 140 is substantially homogeneous. In additional embodiments, each of the insulative line structures 140 is heterogeneous. Each insulative line structures 140 may, for example, be formed of and include a stack of at least two different dielectric materials.

Still referring to FIG. 1F, individual digit line contact structures 142 may be at least partially (e.g., substantially) horizontally aligned in the X-direction with individual insulative line structures 140 (and, hence, individual digit line structures 139). For example, horizontal centerlines of the digit line contact structures 142 in the X-direction may be substantially aligned with horizontal centerlines of the insulative line structures 140 in the X-direction. In addition, the digit line contact structures 142 may be formed at desired locations in the Y-direction along the insulative line structures 140 (and, hence, the digit line structures 139). In some embodiments, at least some of the digit line contact structures 142 are provided at different positions in the Y-direction than one another. For example, a first of the digit line contact structures 142 may be provided at different position along a length in the Y-direction of a first of the insulative line structures 140 as compared to a position of a second of the digit line contact structures 142 along a length in the Y-direction of a second of the insulative line structures 140. Put another way, at least some (e.g., all) of the digit line contact structures 142 may be horizontally offset from one another in the Y-direction. In additional embodiments, two or more of the digit line contact structures 142 are horizontally aligned with one another in the Y-direction. In some embodiments, the digit line contact structures 142 are employed as digit line contact structures (e.g., data line contact structures, bit line contact structures) for a microelectronic device (e.g., a memory device) to be formed using the microelectronic device structure 100, as described in further detail below.

The digit line contact structures 142 may be formed to exhibit desired geometric configurations (e.g., desired dimensions, desired shapes). As shown in FIG. 1F, in some embodiments, the first portion 142A (e.g., upper portion) of an individual digit line contact structure 142 is formed to wider than the second portion 142B (e.g., lower portion) of the digit line contact structure 142. Side surfaces of the isolation material 146 may define horizontal boundaries of the digit line contact structure 142. The digit line contact structures 142 may vertically extend (e.g., in the Z-direction) from lower vertical boundaries (e.g., lower surfaces) of the bond pads 144 to upper vertical boundaries (e.g., upper surfaces) of the digit line structures 139.

The digit line contact structures 142 may each individually be formed of and include conductive material. By way of non-limiting example, the digit line contact structures 142 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit line contact structures 142 are formed of and include Cu. In additional embodiments, the digit line contact structures 142 are formed of and include W.

The bond pads 144 may be formed on or over upper surfaces of the digit line contact structures 142. The bond pads 144 may be formed to horizontally extend over multiple insulative line structures 140 (and, hence, over multiple digit line structures 139). Individual bond pads 144 may be coupled to individual digit line contact structures 142. The bond pads 144 may be employed to couple the digit line contact structures 142 to additional bond pads and additional conductive contact structures, as described in further detail below.

The bond pads 144 may each individually be formed of and include conductive material. By way of non-limiting example, the bond pads 144 may be formed of and include one or more of at least one metal, at least one alloy, and at least one conductive metal-containing material (e.g., a conductive metal nitride, a conductive metal silicide, a conductive metal carbide, a conductive metal oxide). A material composition of the bond pads 144 may be substantially the same as a material composition of the digit line contact structures 142, or the material composition of the bond pads 144 may be different than the material composition of the digit line contact structures 142. In some embodiments, the bond pads 144 are formed of and include Cu.

Still referring to FIG. 1F, the isolation material 146 may be formed of and include at least one insulative material. By way of non-limiting example, the isolation material 146 may be formed of and include one or more of at least one dielectric oxide material (e.g., one or more of $SiO_x$, phosphosilicate glass, borosilicate glass, borophosphosilicate glass, fluorosilicate glass, $Al_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the isolation material 146 is formed of and includes $SiO_x$ (e.g., $SiO_2$). The isolation material 146 may be substantially homogeneous, or the isolation material 146 may be heterogeneous. If the isolation material 146 is heterogeneous, amounts of one or more elements included in the isolation material 146 may vary stepwise (e.g., change abruptly), or may vary continuously (e.g., change progressively, such as linearly, parabolically) throughout different portions of the isolation material 146. In some embodiments, the isolation material 146 is substantially homogeneous. In additional embodiments, the isolation material 146 is heterogeneous. The isolation material 146 may, for example, be formed of and include a stack of at least two different dielectric materials.

The microelectronic device structure 100 following the process stage previously described with reference to FIG. 1F may be used to form a microelectronic device (e.g., a memory device, such as a 3D NAND Flash memory device) of the disclosure. By way of non-limiting example, FIGS. 2A through 2H are simplified, partial cross-sectional views illustrating a method of forming a microelectronic device, in accordance with embodiments of the disclosure. With the description provided below, it will be readily apparent to one of ordinary skill in the art that the methods and structures described herein may be used to form various devices and electronic systems.

Figure 2A:
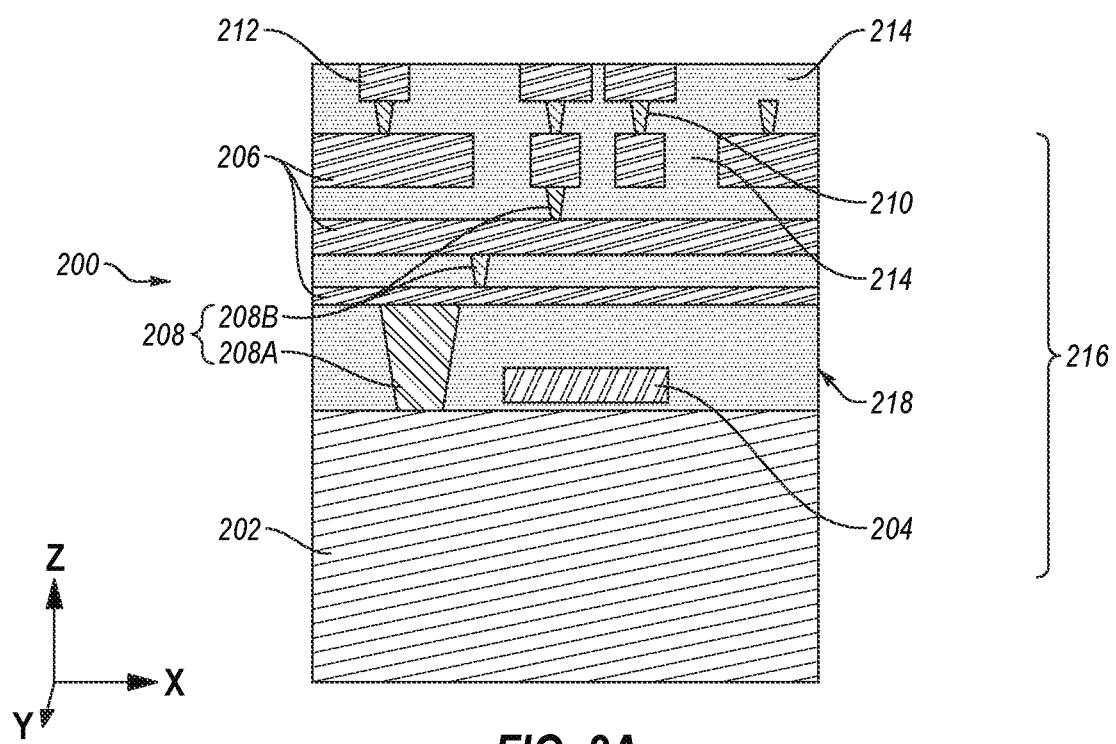
FIGS. 2A through 2H are simplified, partial cross-sectional views illustrating a method of forming a microelectronic device using the microelectronic device structure formed through the method described with reference to FIGS. 1A through 1F, in accordance with embodiments of the disclosure.

Referring to FIG. 2A, an additional microelectronic device structure 200 to subsequently be attached to the microelectronic device structure 100 (FIG. 1F) may be formed. The additional microelectronic device structure 200 may be formed to include a semiconductive base structure 202, gate structures 204, first routing structures 206, first contact structures 208, second contact structures 210, additional bond pads 212, and an additional isolation material 214. The additional microelectronic device structure 200 may form a control logic region 216 of a microelectronic device to subsequently be formed using the additional microelectronic device structure 200 and the microelectronic device structure 100 (FIG. 1F), as described in further detail below. Portions of the semiconductive base structure 202, the gate structures 204, the first routing structures 206, and the first contact structures 208 of the additional microelectronic device structure 200 form various control logic devices 218 of the control logic region 216, as also described in further detail below.

The semiconductive base structure 202 (e.g., semiconductive wafer) of the additional microelectronic device structure 200 comprises a base material or construction upon which additional features (e.g., materials, structures, devices) of the additional microelectronic device structure 200 are formed. The semiconductive base structure 202 may comprise a semiconductive structure (e.g., a semiconductive wafer), or a base semiconductive material on a supporting structure. For example, the semiconductive base structure 202 may comprise a conventional silicon substrate (e.g., a conventional silicon wafer), or another bulk substrate comprising a semiconductive material. In some embodiments, the semiconductive base structure 202 comprises a silicon wafer. In addition, the semiconductive base structure 202 may include one or more layers, structures, and/or regions formed therein and/or thereon. For example, the semiconductive base structure 202 may include conductively doped regions and undoped regions. The conductively doped regions may, for example, be employed as source regions and drain regions for transistors of the control logic devices 218 of the control logic region 216; and the undoped regions may, for example, be employed as channel regions for the transistors of the control logic devices 218.

As shown in FIG. 2A, the gate structures 204 of the control logic region 216 of the additional microelectronic device structure 200 may vertically overlie (e.g., in the Z-direction) portions of the semiconductive base structure 202. The gate structures 204 may individually horizontally extend between and be employed by transistors of the control logic devices 218 within the control logic region 216 of the additional microelectronic device structure 200. The gate structures 204 may be formed of and include conductive material. A gate dielectric material (e.g., a dielectric oxide) may vertically intervene (e.g., in the Z-direction) between the gate structures 204 and channel regions (e.g., within the semiconductive base structure 202) of the transistors.

The first routing structures 206 may vertically overlie (e.g., in the Z-direction) the semiconductive base structure 202, and may be electrically connected to the semiconductive base structure 202 by way of the first contact structures 208. The first routing structures 206 may serve as local routing structures for a microelectronic device to subsequently be formed using the additional microelectronic device structure 200 and the microelectronic device structure 100 (FIG. 1F). A first group 208A of the first contact structures 208 may vertically extend between and couple regions (e.g., conductively doped regions, such as source regions and drain regions) of the semiconductive base structure 202 to one or more of the first routing structures 206. In addition, a second group 208B of the first contact structures 208 may vertically extend between and couple some of the first routing structures 206 to one another.

The first routing structures 206 may each individually be formed of and include conductive material. By way of non-limiting example, the first routing structures 206 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 206 are formed of and include Cu. In additional embodiments, the first routing structures 206 are formed of and include W.

The first contact structures 208 (including the first group 208A and the second group 208B thereof) may each individually be formed of and include conductive material. By way of non-limiting example, the first routing structures 206 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 208 are formed of and include Cu. In additional embodiments, the first contact structures 208 are formed of and include W. In further embodiments, the first contact structures 208 of the first group 208A of the first contact structures 208 are formed of and include first conductive material (e.g., W); and the first contact structures 208 of the second group 208B of the first contact structures 208 are formed of and include a second, different conductive material (e.g., Cu).

As previously mentioned, portions of the semiconductive base structure 202 (e.g., conductively doped regions serving as source regions and drain regions, undoped regions serving as channel regions), the gate structures 204, the first routing structures 206, and the first contact structures 208 form various control logic devices 218 of the control logic region 216. In some embodiments, the control logic devices 218 comprise complementary metal oxide semiconductor (CMOS) circuitry. The control logic devices 218 may be configured to control various operations of other components (e.g., memory cells) of a microelectronic device (e.g., a memory device) to subsequently be formed using the additional microelectronic device structure 200 and the microelectronic device structure 100 (FIG. 1F). As a non-limiting example, the control logic devices 218 may include one or more (e.g., each) of charge pumps (e.g., $V_{CCP}$ charge pumps, $V_{NEGEL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry.

With continued reference to FIG. 2A, the second contact structures 210 of the additional microelectronic device structure 200 may vertically overlie and be coupled to some of the first routing structures 206 of the control logic region 216. In some embodiments, the second contact structures 210 comprise conductively filled vias vertically extending through portions of the additional isolation material 214 interposed between the additional bond pads 212 and the first routing structures 206. The second contact structures 210 may be formed of and include conductive material. By way of non-limiting example, the second contact structures 210 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the second contact structures 210 is formed of and includes Cu.

The additional bond pads 212 of the additional microelectronic device structure 200 may vertically overlie and be coupled to the second contact structures 210. The second contact structures 210 may vertically extend from and between the additional bond pads 212 and some of the first routing structures 206. The additional bond pads 212 may be configured and positioned for attachment to the bond pads 144 (FIG. 1F) of the microelectronic device structure (FIG. 1F) to form connected bond pads, as described in further detail below. The additional bond pads 212 may be formed of and include conductive material. By way of non-limiting example, the additional bond pads 212 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the additional bond pads 212 is formed of and includes Cu.

Still referring to FIG. 2A, the additional isolation material 214 may cover and surround portions of at least the first routing structures 206, the second contact structures 210, and the additional bond pads 212. The additional isolation material 214 may subsequently be attached to the isolation material 146 (FIG. 1F) of the microelectronic device structure 100 (FIG. 1F) in the process of forming a microelectronic device (e.g., a memory device) using the microelectronic device structure 100 (FIG. 1F) and the additional microelectronic device structure 200, as described in further detail below. A material composition of the additional isolation material 214 may be substantially the same as a material composition of the isolation material 146 (FIG. 1F), or the material composition of the additional isolation material 214 may be different than the material composition of the isolation material 146 (FIG. 1F). In some embodiments, the additional isolation material 214 is formed of and includes at least one dielectric oxide material, such as $SiO_x$ (e.g., $SiO_2$). In additional embodiments, the additional isolation material 214 is formed of and includes at least one low-k dielectric material, such as one or more of $SiO_xC_y$, $SiO_xN_y$, $SiC_xO_yH_z$, and $SiO_xC_zN_y$. The additional isolation material 214 may be substantially homogeneous, or the additional isolation material 214 may be heterogeneous. In some embodiments, the additional isolation material 214 is substantially homogeneous. In additional embodiments, the additional isolation material 214 is heterogeneous. The additional isolation material 214 may, for example, be formed of and include a stack of at least two different dielectric materials.

Figure 2B:
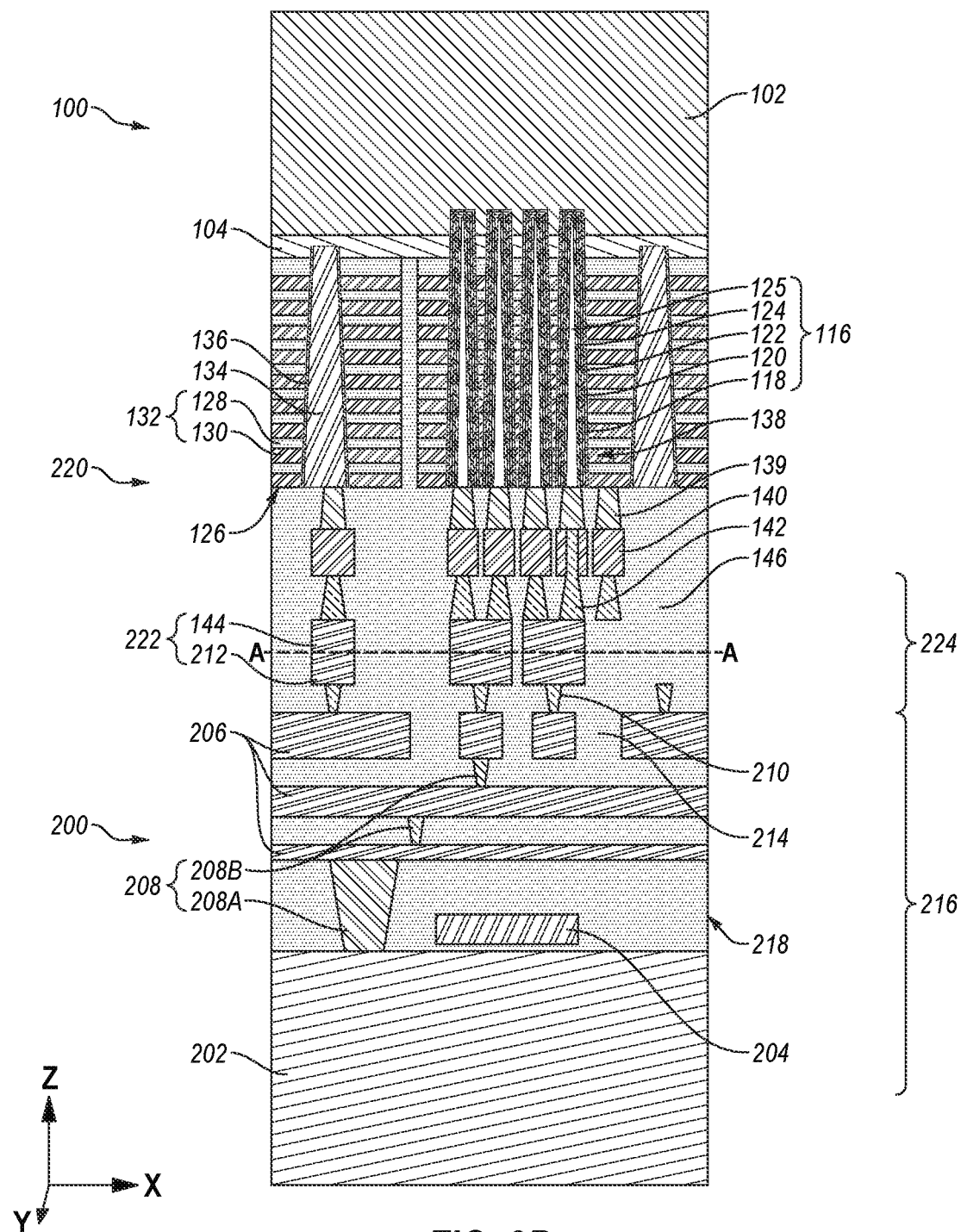

Referring to next to FIG. 2B, following the formation of the microelectronic device structure 100 and the separate formation of the additional microelectronic device structure 200, the microelectronic device structure 100 may be vertically inverted (e.g., flipped upside down in the Z-direction) and attached (e.g., bonded) to the additional microelectronic device structure 200 to form a microelectronic device structure assembly 220. Alternatively, the additional microelectronic device structure 200 may be vertically inverted (e.g., flipped upside down in the Z-direction) and attached to the microelectronic device structure 100 to form the microelectronic device structure assembly 220. The attachment of the microelectronic device structure 100 to the additional microelectronic device structure 200 may attach the bond pads 144 of the microelectronic device structure 100 to the additional bond pads 212 of the additional microelectronic device structure 200 to form connected bond pads 222. In addition, the attachment of the microelectronic device structure 100 to the additional microelectronic device structure 200 may also attach the isolation material 146 of the microelectronic device structure 100 to the additional isolation material 214 of the additional microelectronic device structure 200. As shown in FIG. 2B, the attachment of the microelectronic device structure 100 to the additional microelectronic device structure 200 may form a first interconnect region 224 of a microelectronic device (e.g., memory device, such as a 3D NAND Flash memory device) to subsequently be formed using the microelectronic device structure assembly 220. In FIG. 2B, vertical boundaries of the microelectronic device structure 100 relative to the additional microelectronic device structure 200 prior to the attachment of the microelectronic device structure 100 to the additional microelectronic device structure 200 to form the microelectronic device structure assembly 220 are depicted by the dashed line A-A. The microelectronic device structure 100 may be attached to the additional microelectronic device structure 200 without a bond line.

As shown in FIG. 2B, the connected bond pads 222 of the first interconnect region 224 may vertically extend from and between the digit line contact structures 142 of the microelectronic device structure 100 and the second contact structures 210 of the additional microelectronic device structure 200. The additional bond pads 212 of the connected bond pads 222 may vertically extend from and between the second contact structures 210 and the bond pads 144 of the connected bond pads 222; and the bond pads 144 of the connected bond pads 222 may vertically extend from and between the digit line contact structures 142 and the additional bond pads 212 of the connected bond pads 222. While in FIG. 2B, the additional bond pad 212 and the bond pad 144 of each connected bond pad 222 are distinguished from one another by way of a dashed line, the additional bond pad 212 and the bond pad 144 may be integral and continuous with one another. Put another way, each connected bond pad 222 may be a substantially monolithic structure including the additional bond pad 212 as a first region thereof, and the bond pad 144 as a second region thereof. For each connected bond pad 222, the additional bond pad 212 thereof may be attached to the bond pad 144 thereof without a bond line.

Figure 2C:
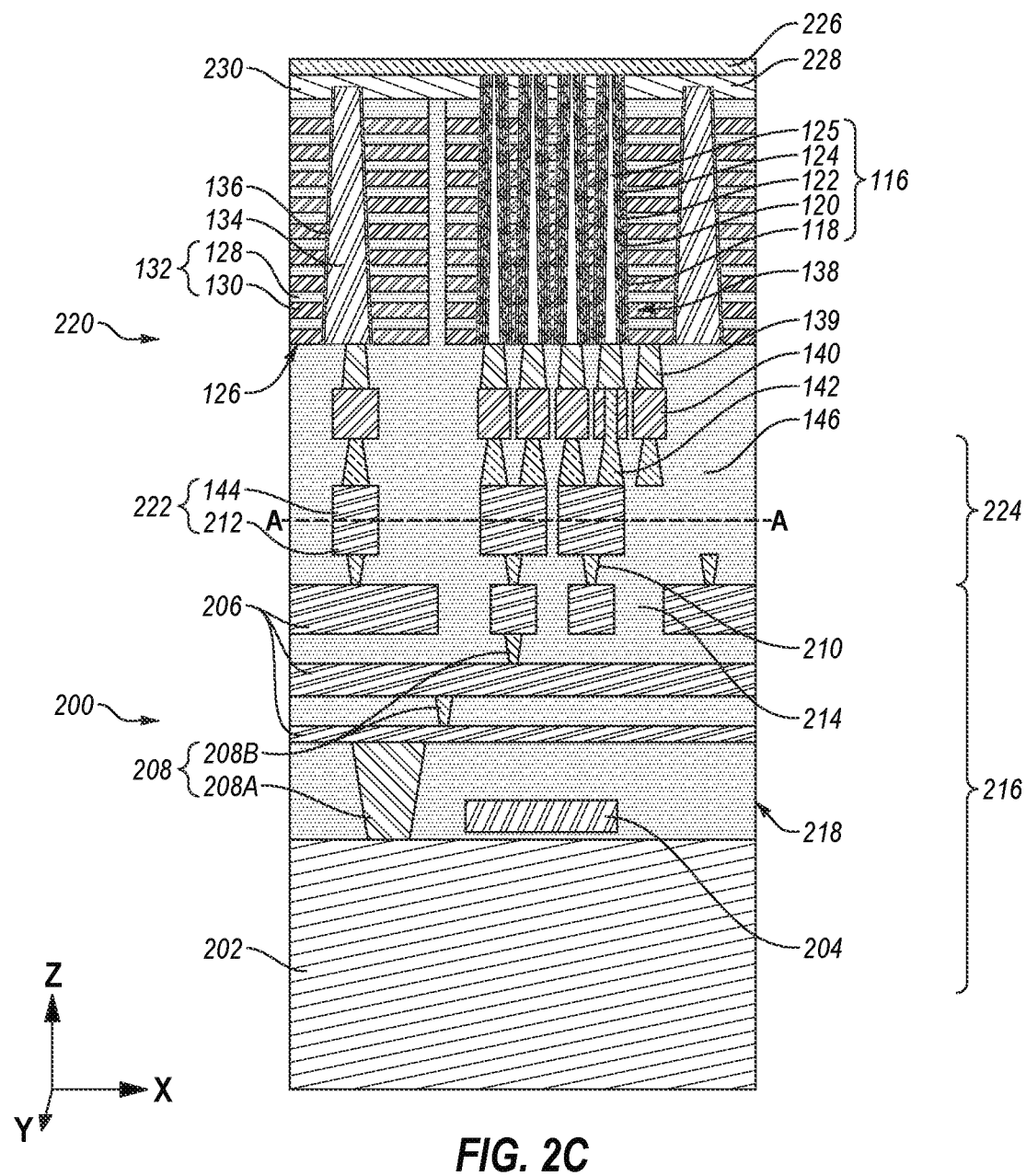

Referring next to FIG. 2C, after attaching the microelectronic device structure 100 (FIG. 2B) to the additional microelectronic device structure 200, the base structure 102 (FIG. 2B) and portions of the cell pillar structures 116 may be removed (e.g., through conventional detachment processes and/or conventional grinding processes). The material removal process may expose (e.g., uncover) the doped semiconductive material 104. In some embodiments, the material removal process also exposes remaining (e.g., unremoved) portions of the cell pillar structures 116. Upper surfaces of the doped semiconductive material 104 and the cell pillar structures 116 may be substantially coplanar with one another following the material removal process, or upper surfaces of the doped semiconductive material 104 and the cell pillar structures 116 may be vertically offset from one another following the material removal process. In addition, optionally, an additional amount (e.g., additional volume) of doped semiconductive material (e.g., doped polycrystalline silicon) may be formed on the doped semiconductive material 104 following the removal of the base structure 102 (FIG. 2B). If formed, the additional amount of doped semiconductive material may have substantially the same material composition as that of the doped semiconductive material 104, or may have a different material composition than that of the doped semiconductive material 104. In addition, optionally, a strapping material 226 may optionally be formed on or over the doped semiconductive material 104. The doped semiconductive material 104 (and the additional amount of doped semiconductive material, if any) may, optionally, be annealed (e.g., thermally annealed) before and/or after the formation of the strapping material 226 (if any). Annealing the doped semiconductive material 104 may, for example, facilitate or enhance dopant activation within the doped semiconductive material 104.

If formed, the strapping material 226 may be formed of and include conductive material. By way of non-limiting example, the strapping material 226 (if any) may be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the strapping material 226 is formed of and includes tungsten silicide ($WSi_x$). In additional embodiments, the strapping material 226 is formed of and include one or more of (e.g., a stack of) W and tungsten nitride ($WN_x$).

Figure 2D:
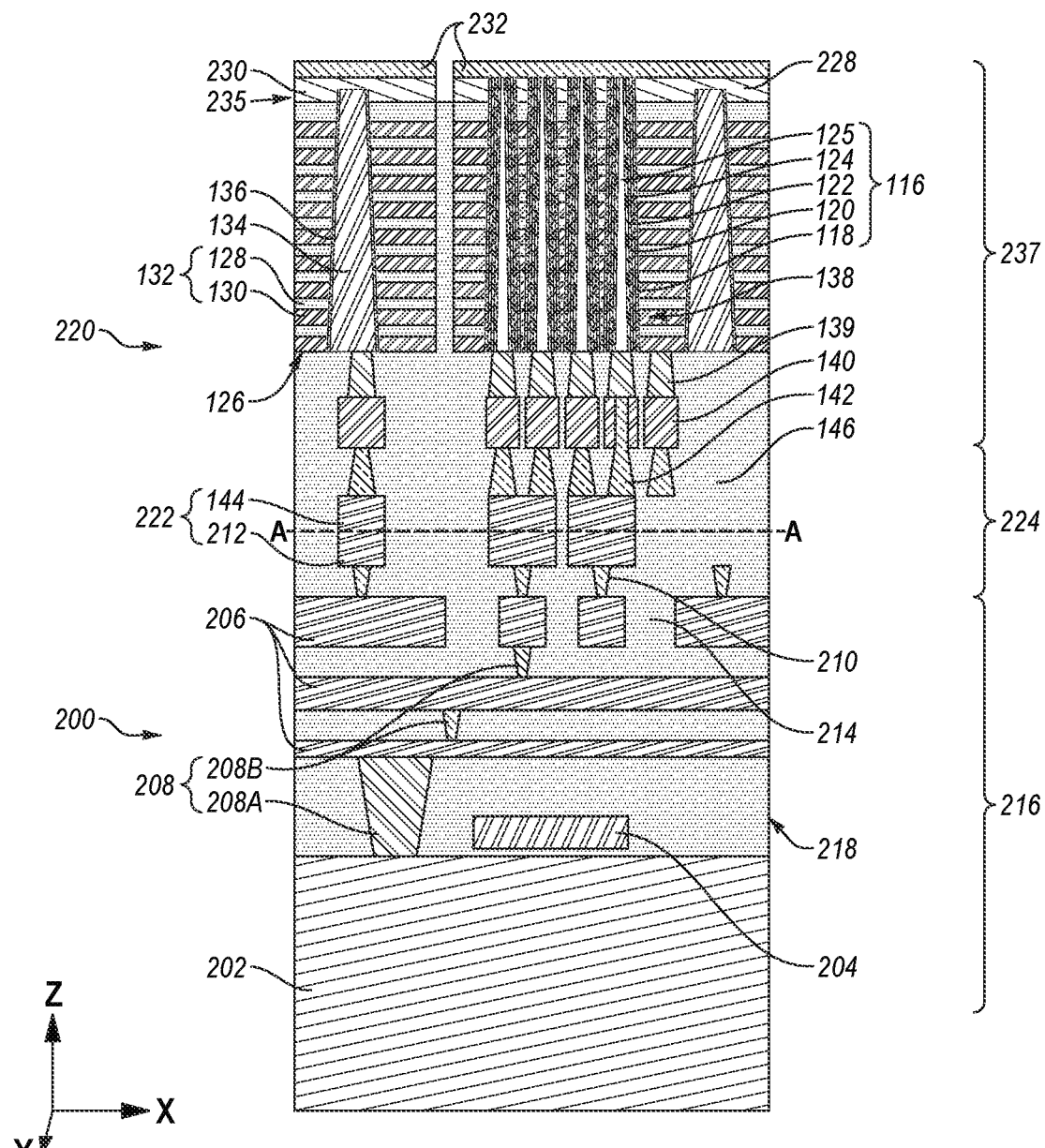

Referring next to FIG. 2D, following the removal of the base structure 102 (FIG. 2B), portions of the doped semiconductive material 104 (and the additional amount of doped semiconductive material, if any) (FIG. 2C) and the strapping material 226 (FIG. 2C) (if any) may be removed (e.g., etched) to form one or more source structures 228 and one or more contact pads 230 from the doped semiconductive material 104 (FIG. 2C), and to form strapping structures 232 from the strapping material 226 (FIG. 2C) (if any). As shown in FIG. 2D, the formation of the source structure(s) 228 and the contact pad(s) 230 may form a memory array region 237 of a microelectronic device (e.g., memory device) to subsequently be formed using the microelectronic device structure assembly 220. The memory array region 237 may include the stack structure 126; the cell pillar structures 116; the deep contact structures 134; the digit line structures 139; the insulative line structures 140; portions (e.g., the second portions 142B (FIG. 1F)) of the digit line contact structures 142; and a source tier 235 including the source structure(s) 228, the contact pad(s) 230, and the strapping structures 232 (if any).

Within the source tier 235 of the memory array region 237, the source structure(s) 228 and the contact pad(s) 230 may horizontally neighbor one another (e.g., in the X-direction, in the Y-direction). The source structure(s) 228 may be electrically isolated from the contact pad(s) 230, and may be positioned at substantially the same vertical position (e.g., in the Z-direction) as the contact pad(s) 230. The source structure(s) 228 may be coupled to the vertically extending strings of memory cells 138. The contact pad(s) 230 may be coupled to additional conductive features within the stack structure 126, such as one or more of the deep contact structures 134.

The processing acts described above with respect to FIGS. 1A through 1F and FIGS. 2A through 2C effectuate the formation of the source structure(s) 228, the contact pad(s) 230, and the strapping structures 232 (if any) after (e.g., subsequent to, following) the formation of other features of the memory array region 237, and after the attachment of the microelectronic device structure 100 (FIG. 2B) to the additional microelectronic device structure 200.

Figure 2E:
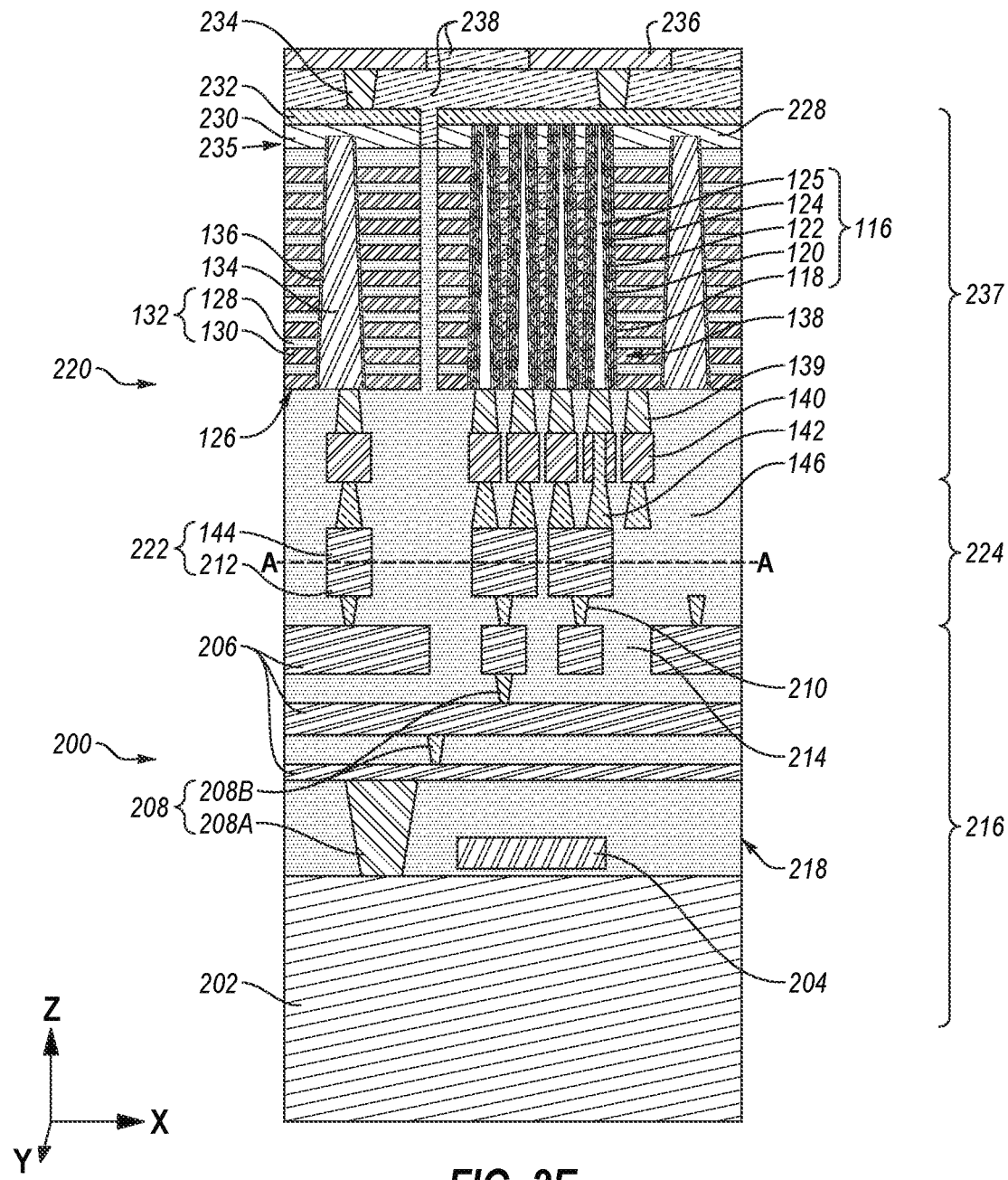

Referring next to FIG. 2E, third contact structures 234 may be formed over and in electrical communication with the source structure(s) 228 and the contact pad(s) 230, and second routing structures 236 may be formed over and in electrical communication with the third contact structures 234. The third contact structures 234 may be formed to extend between the second routing structures 236 and the source structure(s) 228 and the contact pad(s) 230 of the source tier 235. If present, the strapping structures 232 may vertically intervene between the third contact structures 234 and the source structure(s) 228 and the contact pad(s) 230. The third contact structures 234 may, for example, be formed on upper surfaces of the strapping structures 232. In addition, as shown in FIG. 2E, at least one insulative material 238 may be formed to cover and surround the third contact structures 234 and the second routing structures 236. The at least one insulative material 238 may also be formed to cover and surround portions of the source structure(s) 228 and the contact pad(s) 230.

The third contact structures 234 and the second routing structures 236 may each be formed of and include conductive material. By way of non-limiting example, the third contact structures 234 and the second routing structures 236 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 234 and the second routing structures 236 are each formed of and include Cu. In additional embodiments, the third contact structures 234 are formed of and include W, and the second routing structures 236 are formed of and include Cu.

Still referring to FIG. 2E, in some embodiments, the insulative material 238 is formed of and includes at least one dielectric oxide material, such as $SiO_x$ (e.g., $SiO_2$). In additional embodiments, the insulative material 238 is formed of and includes at least one low-k dielectric material, such as one or more of $SiO_xC_y$, $SiO_xN_y$, $SiC_xO_yH_z$, and $SiO_xC_zN_y$. The insulative material 238 may be substantially homogeneous, or the insulative material 238 may be heterogeneous. If the insulative material 238 is heterogeneous, amounts of one or more elements included in the insulative material 238 may vary stepwise (e.g., change abruptly), or may vary continuously (e.g., change progressively, such as linearly, parabolically) throughout different portions of the insulative material 238. In some embodiments, the insulative material 238 is substantially homogeneous. In additional embodiments, the insulative material 238 is heterogeneous. The insulative material 238, for example, be formed of and include a stack of at least two different dielectric materials.

Figure 2F:
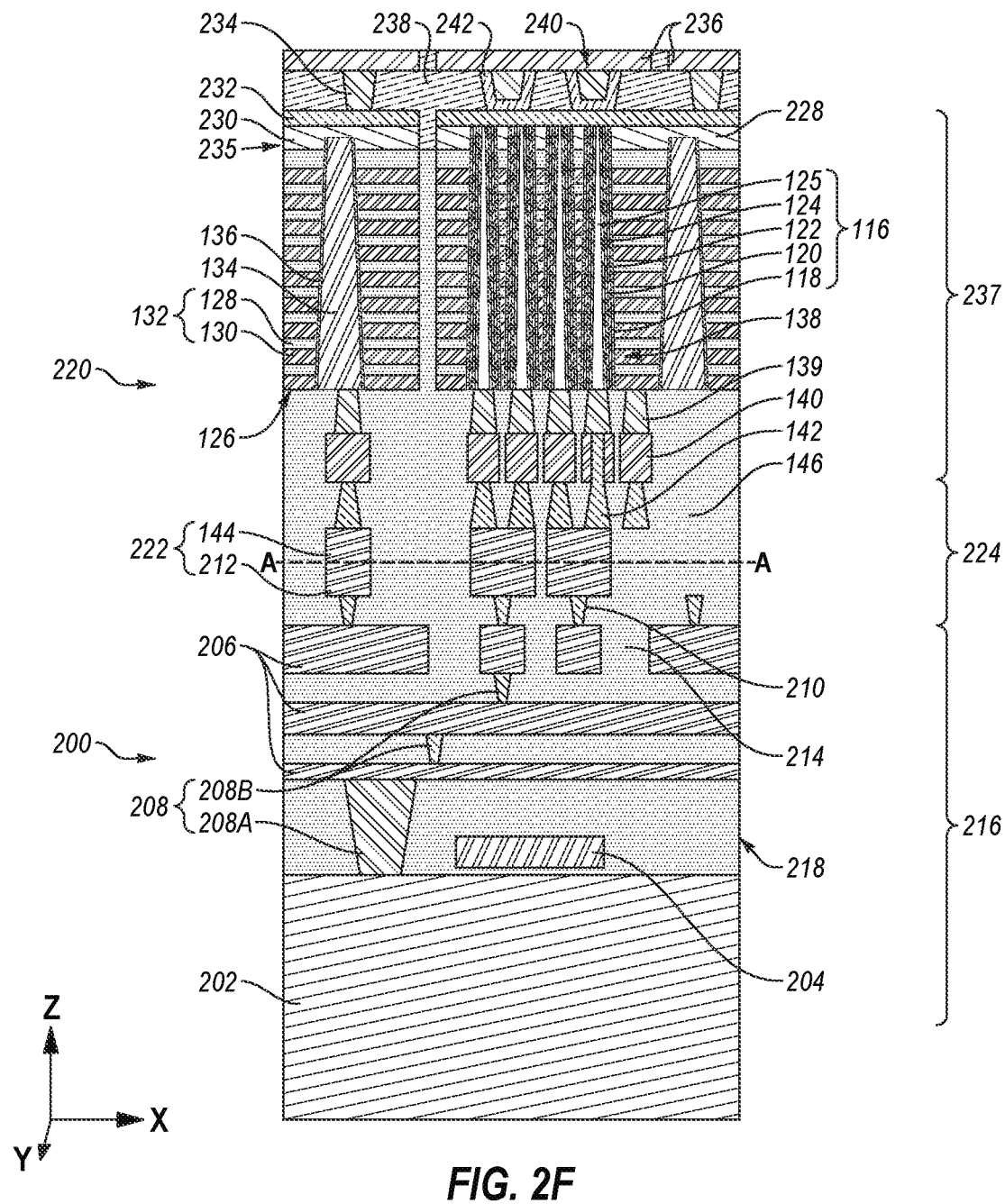
Figure 2G:
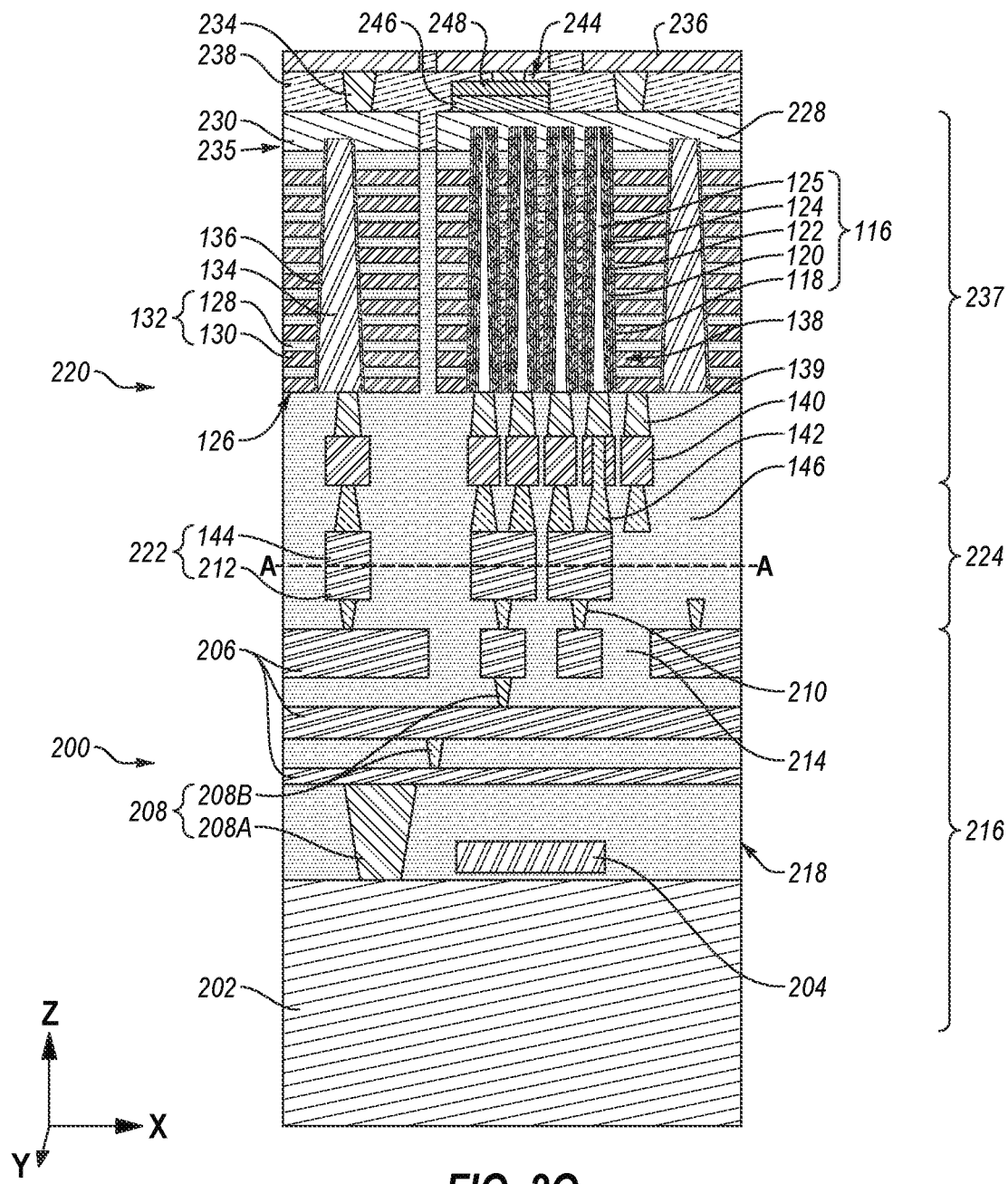

In additional embodiments, one or more capacitors (e.g., one or more metal-insulator-metal (MIM) capacitors; one or more metal-insulator-semiconductor (MIS) capacitors) may be formed at the processing stage described above with reference to FIG. 2E. By way of non-limiting example, FIGS. 2F and 2G are simplified, partial cross-sectional views illustrating embodiments of the disclosure wherein capacitors are formed over the source tier 235 previously described with reference to FIG. 2D. FIG. 2F shows an embodiment of the disclosure wherein one or more MIM capacitors are formed over the source tier 235. FIG. 2G shows an embodiment of the disclosure wherein one or more MIS capacitors are formed over the source tier 235.

Referring to FIG. 2F, in some embodiments, one or more MIM capacitors 240 are formed over the source tier 235. An individual MIM capacitor 240 may include a portion of an individual strapping structure 232, an insulative structure 242 on or over the strapping structure 232, and an individual third contact structure 234 on or over the insulative structure 242. The portion of the strapping structure 232 may serve a first metal structure of the MIM capacitor 240, the third contact structure 234 may serve as a second metal structure of the MIM capacitor 240, and the insulative structure 242 may intervene between the strapping structure 232 and the third contact structure 234. As shown in FIG. 2F, for an individual MIM capacitor 240, the insulative structure 242 thereof may be positioned directly adjacent a lower surface and side surfaces of the third contact structure 234. The insulative structure 242 may be interposed between the lower surface of the third contact structure 234 and an upper surface of a strapping structure 232 associated with the MIM capacitor 240, and may also be interposed between the side surfaces of the third contact structure 234 and side surfaces of the insulative material 238 horizontally surrounding the third contact structures 234. In additional embodiments, a metallic structure (e.g., a metal structure, an alloy structure) is formed between the strapping structure 232 and the insulative structure 242, and serves as the first metal structure of the MIM capacitor 240.

The insulative structure 242 of an individual MIM capacitor 240 may be formed of and include insulative material. For example, the insulative structure 242 may be formed of and include at least one dielectric oxide material, such as one or more of $SiO_x$; phosphosilicate glass; borosilicate glass; borophosphosilicate glass; fluorosilicate glass; $AlO_x$; and a high-k oxide, such as one or more of $HfO_x$, $NbO_x$, and $TiO_x$. In some embodiments, the insulative structure 242 is formed of and includes at least one high-k oxide (e.g., one or more of $HfO_x$, $NbO_x$, and $TiO_x$). In additional embodiments, the insulative structure 242 is formed of and includes $SiO_x$ (e.g., $SiO_2$).

The MIM capacitor(s) 240 may be formed using conventional processes (e.g., conventional material deposition processes, conventional material removal processes, such as conventional etching processes) and conventional processing equipment, which are not described in detail herein. One or more masks (e.g., one or more i-line masks) may be employed to protect insulative material (e.g., high-k oxide) of the insulative structure(s) 242 during patterning and etching processes employed to form the MIM capacitor(s) 240.

Referring next to FIG. 2G, in additional embodiments, one or more MIS capacitors 244 are formed over the source tier 235. An individual MIS capacitor 244 may include a portion of an individual source structure 228, an insulative structure 246 on or over the source structure 228, and a metallic structure 248 on or over the insulative structure 246. The metallic structure 248 may serve as a metal structure of the MIS capacitor 244, the portion of the source structure 228 may serve a semiconductive structure (e.g., a conductively doped semiconductive structure) of the MIS capacitor 244, and the insulative structure 246 may intervene between the source structure 228 and the metallic structure 248. As shown in FIG. 2G, for an individual MIS capacitor 244, the insulative structure 246 thereof may be interposed between a lower surface of the metallic structure 248 and an upper surface of the source structure 228 associated with the MIS capacitor 244. As shown in FIG. 2G, the strapping structure 232 (FIG. 2E) may not be positioned vertically between and in contact with the source structure 228 and the insulative structure 246 of the MIS capacitor 244. In some such embodiments, the strapping structures 232 are omitted (e.g., absent) from upper surfaces of the source structure(s) 228 and the contact pad(s) 230 of the source tier 235. In additional embodiments, strapping structures 232 are formed over portions of the upper surfaces of the source structure(s) 228 and the contact pad(s) 230 outside of horizontal boundaries of the MIS capacitor(s) 244, but are omitted from other portions of upper surfaces of the source structure(s) 228 within horizontal boundaries the MIS capacitor(s) 244.

The insulative structure 246 of an individual MIS capacitor 244 may be formed of and include insulative material. For example, the insulative structure 246 may be formed of and include at least one dielectric oxide material, such as one or more of $SiO_x$; phosphosilicate glass; borosilicate glass; borophosphosilicate glass; fluorosilicate glass; $AlO_x$; and a high-k oxide, such as one or more of $HfO_x$, $NbO_x$, and $TiO_x$. In some embodiments, the insulative structure 246 is formed of and includes at least one high-k oxide (e.g., one or more of $HfO_x$, $NbO_x$, and $TiO_x$). In additional embodiments, the insulative structure 246 is formed of and includes $SiO_x$ (e.g., $SiO_2$).

Still referring to FIG. 2G, the metallic structure 248 of an individual MIS capacitor 244 may be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the metallic structure 248 of one or more MIS capacitors 244 is formed of and includes W.

The MIS capacitor(s) 244 may be formed using conventional processes (e.g., conventional material deposition processes, conventional material removal processes, such as conventional etching processes) and conventional processing equipment, which are not described in detail herein. One or more masks (e.g., one or more i-line masks) may be employed to protect insulative material (e.g., high-k oxide) of the insulative structure(s) 246 during patterning and etching processes employed to form the MIS capacitor(s) 244.

Figure 2H:
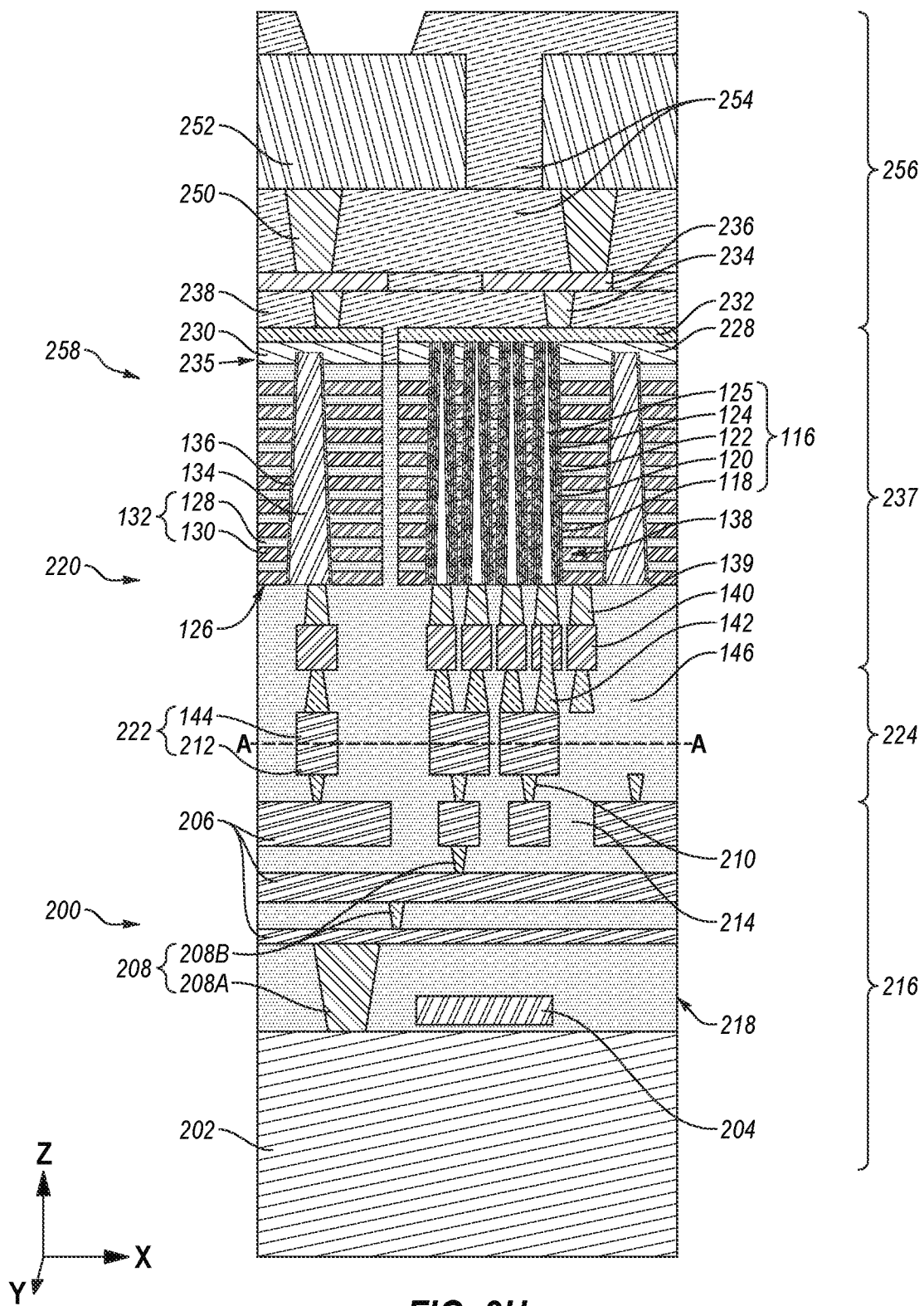

With returned reference to FIG. 2E, following the formation of the second routing structures 236, the microelectronic device structure assembly 220 may be subjected to additional processing to couple additional features to the second routing structures 236. For example, referring to FIG. 2H, fourth contact structures 250 may be formed over and in electrical communication with the second routing structures 236, and conductive pads 252 may be formed over and in electrical communication with the fourth contact structures 250. The fourth contact structures 250 may be formed to extend between the second routing structures 236 and the conductive pads 252. The fourth contact structures 250 may, for example, be formed on upper surfaces of the second routing structures 236, and the conductive pads 252 may be formed on upper surfaces of the fourth contact structures 250. In addition, as shown in FIG. 2H, at least one additional insulative material 254 may be formed to cover and surround the fourth contact structures 250 and the conductive pads 252. The at least one additional insulative material 254 may also be formed to cover and surround portions of the second routing structures 236 and the insulative material 238.

The fourth contact structures 250 and the conductive pads 252 may each be formed of and include conductive material. By way of non-limiting example, the fourth contact structures 250 and the conductive pads 252 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth contact structures 250 are formed of and include W, and the conductive pads 252 are formed of and include Al.

Still referring to FIG. 2H, a material composition of the additional insulative material 254 may be substantially the same as a material composition of the insulative material 238, or a material composition of the additional insulative material 254 may be different than a material composition of the insulative material 238. In some embodiments, the additional insulative material 254 is formed of and includes at least one dielectric oxide material, such as $SiO_x$ (e.g., $SiO_2$). In additional embodiments, the additional insulative material 254 is formed of and includes at least one low-k dielectric material, such as one or more of $SiO_xC_y$, $SiO_xN_y$, $SiC_xO_yH_z$, and $SiO_xC_zN_y$. The additional insulative material 254 may be substantially homogeneous, or the additional insulative material 254 may be heterogeneous. If the additional insulative material 254 is heterogeneous, amounts of one or more elements included in the additional insulative material 254 may vary stepwise (e.g., change abruptly), or may vary continuously (e.g., change progressively, such as linearly, parabolically) throughout different portions of the additional insulative material 254. In some embodiments, the additional insulative material 254 is substantially homogeneous. In additional embodiments, the additional insulative material 254 is heterogeneous. The additional insulative material 254, for example, be formed of and include a stack of at least two different dielectric materials.

As shown in FIG. 2H, the formation of the fourth contact structures 250, the conductive pads 252, and the additional insulative material 254 may form a second interconnect region 256. The second interconnect region 256 may include the third contact structures 234, the second routing structures 236, the insulative material 238, the fourth contact structures 250, the conductive pads 252, and the additional insulative material 254. In addition, the formation of the second interconnect region 256 may effectuate the formation of a microelectronic device 258 (e.g., a memory device, such as a 3D NAND Flash memory device). The microelectronic device 258 may include the control logic region 216, the first interconnect region 224, the memory array region 237, and the second interconnect region 256. At least the second routing structures 236 and the conductive pads 252 of the second interconnect region 256 may serve as global routing structures for the microelectronic device 258. The second routing structures 236 and the conductive pads 252 may, for example, be configured to receive global signals from an external bus, and to relay the global signals to other components (e.g., structures, devices) of the microelectronic device 258.

Thus, in accordance with embodiments of the disclosure, a method of forming a microelectronic device comprises forming a microelectronic device structure. The microelectronic device structure comprises a base structure, a doped semiconductive material overlying the base structure, a stack structure overlying the doped semiconductive material and comprising a vertically alternating sequence of conductive structures and insulative structures, cell pillar structures vertically extending through the stack structure and the doped semiconductive material and into the base structure, and digit line structures vertically overlying the stack structure. An additional microelectronic device structure comprising control logic devices is formed. The microelectronic device structure is attached to the additional microelectronic device structure to form a microelectronic device structure assembly. The digit line structures are vertically interposed between the stack structure and the control logic devices within the microelectronic device structure assembly. The base structure and portions of the cell pillar structures vertically extending into the base structure are removed to expose the doped semiconductive material. The doped semiconductive material is patterned after removing the base structure and the portions of the cell pillar structures to form at least one source structure over the stack structure and coupled to the cell pillar structures.

Furthermore, in accordance with embodiments of the disclosure, a microelectronic device comprises a memory array region, a control logic region, a first interconnect region, and a second interconnect region. The memory array region comprises a stack structure comprising a vertically alternating sequence of conductive structures and insulating structures, a source structure vertically overlying the stack structure and comprising a doped semiconductive material, cell pillar structures vertically extending completely through the stack structure and at least partially through the source structure, and digit line structures vertically underlying the stack structure and in electrical communication with the cell pillar structures. The control logic region vertically underlies the memory array region and comprises control logic devices. The first interconnect region is vertically interposed between the memory array region and the control logic region and comprises additional conductive structures coupling the digit line structures of the memory array region to the control logic devices of the control logic region. The second interconnect region vertically overlies the memory array region and comprises further conductive structures in electrical communication with the source structure.

Figure 3:
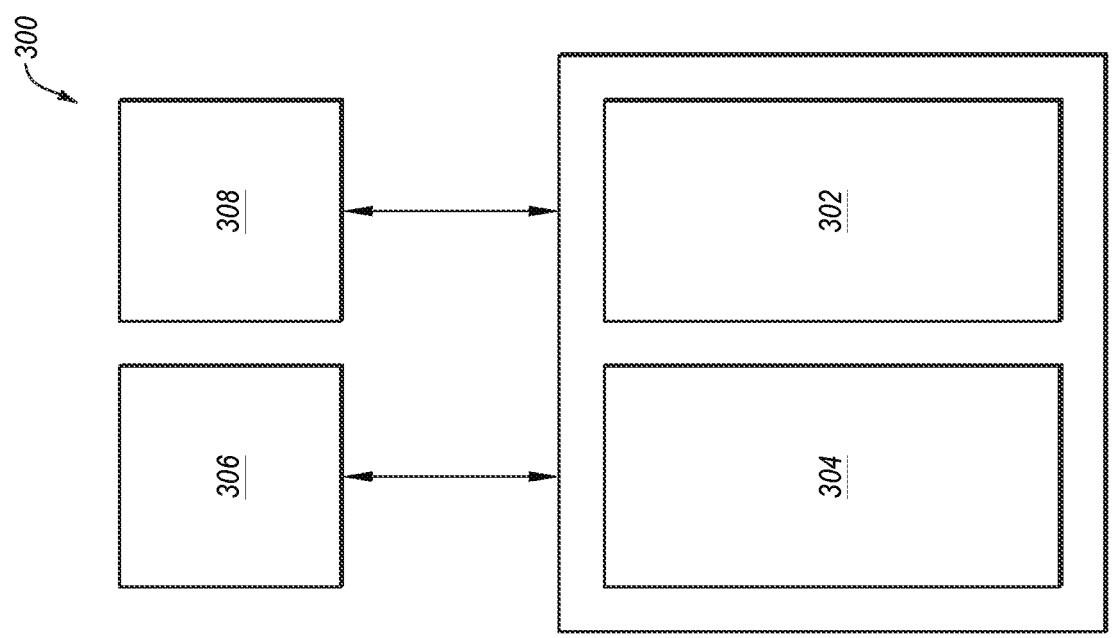
FIG. 3 is a schematic block diagram of an electronic system, in accordance with an embodiment of the disclosure.

Microelectronic devices (e.g., microelectronic device 258 (FIG. 2H)) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, a microelectronic device (e.g., the microelectronic device 258 (FIG. 2H)) previously described herein. The electronic system 300 may further include at least one electronic signal processor device 304 (often referred to as a "microprocessor"). The electronic signal processor device 304 may, optionally, include a microelectronic device (e.g., the microelectronic device 258 (FIG. 2H)) previously described herein. While the memory device 302 and the electronic signal processor device 304 are depicted as two (2) separate devices in FIG. 2A, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic device 258 (FIG. 2H)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises a stack structure, a source structure, digit line structures, cell pillar structures, conductive routing structures, control logic devices, and additional conductive routing structures. The stack structure comprises tiers each comprising a conductive structure and an insulative structure vertically neighboring the conductive structure. The source structure overlies the stack structure. The digit line structures underlie the stack structure. The cell pillar structures are coupled to the digit line structures and vertically extend completely through the stack structure and into the source structure. The conductive routing structures vertically underlie and are coupled to the digit line structures. The control logic devices are coupled to and at least partially vertically underlie the conductive routing structures. The additional conductive routing structures are coupled to and vertically overlie the source structure.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:
    forming a microelectronic device structure comprising:
        a base structure;
        a doped semiconductive material over the base structure;
        a stack structure overlying the doped semiconductive material and comprising a vertically alternating sequence of conductive structures and insulative structures;
        cell pillar structures vertically extending through the stack structure and the doped semiconductive material and into the base structure; and
        digit line structures vertically overlying the stack structure;
    forming an additional microelectronic device structure comprising control logic devices;
    attaching the microelectronic device structure to the additional microelectronic device structure to form a microelectronic device structure assembly, the digit line structures vertically interposed between the stack structure and the control logic devices within the microelectronic device structure assembly;
    removing the base structure and portions of the cell pillar structures vertically extending into the base structure to expose the doped semiconductive material; and
    patterning the doped semiconductive material after removing the base structure and the portions of the cell pillar structures to form at least one source structure over the stack structure and coupled to the cell pillar structures.

2. The method of claim 1, wherein forming a microelectronic device structure comprises forming the microelectronic device structure to further comprise conductive contact structures vertically extending through the stack structure and into the doped semiconductive material.

3. The method of claim 1, wherein forming a microelectronic device structure comprises:
    forming a preliminary stack structure over the doped semiconductive material, the preliminary stack structure comprising a vertically alternating sequence of first insulative structures and second insulative structures;
    forming openings vertically extending through the preliminary stack structure and the doped semiconductive material and into the base structure;
    forming the cell pillar structures within the openings;
    forming slots extending through the preliminary stack structure;
    at least partially replacing the second insulative structures with the conductive structures using the slots to form the stack structure, the insulative structures of the stack structure comprising remaining portions of the first insulative structures; and
    forming the digit line structures over and in electrical communication with the cell pillar structures.

4. The method of claim 1, wherein forming a microelectronic device structure comprises forming the microelectronic device structure to further comprise:
    insulative line structures on the digit line structures;
    digit line contact structures extending through portions of the insulative line structures and contacting the digit line structures; and
    conductive pad structures on the digit line contact structures.

5. The method of claim 4, wherein forming an additional microelectronic device structure comprises forming the microelectronic device structure to further comprise additional conductive pad structures over the control logic devices.

6. The method of claim 5, wherein attaching the microelectronic device structure to the additional microelectronic device structure comprises:
vertically inverting one of the microelectronic device structure and the additional microelectronic device structure; and
bonding the conductive pad structures of the microelectronic device structure to the additional conductive pad structures of the additional microelectronic device structure.

7. The method of claim 1, wherein removing the base structure and portions of the cell pillar structures vertically extending into the base structure to expose the doped semiconductive material comprises forming upper boundaries of remaining portions of the cell pillar structures to be substantially coplanar with an upper boundary of the doped semiconductive material.

8. The method of claim 1, further comprising forming at least one metallic strapping material over the doped semiconductive material prior to patterning the doped semiconductive material.

9. The method of claim 1, further comprising:
forming conductive routing structures over and in electrical communication with the at least one source structure; and
forming conductive pad structures over and in electrical communication with the conductive routing structures.

10. The method of claim 9, further comprising forming at least one metal-insulator-metal (MIM) capacitor vertically over the at least one the source structure and vertically under the conductive routing structures.

11. The method of claim 9, further comprising forming at least one metal-insulator-semiconductor (MIS) capacitor vertically under the conductive routing structures and at least partially vertically over the at least one the source structure.

12. A method of forming a microelectronic device, comprising:
forming a memory array wafer comprising:
doped semiconductive material overlying a base structure;
a stack structure above the doped semiconductive material and comprising a conductive material vertically interleaved with insulative material;
cell pillar structures individually comprising semiconductive material vertically extending completely through the stack structure and the doped semiconductive material and partially through the base structure;
digit lines above the stack structure; and
dielectric material above the digit lines;
forming a control circuitry wafer separate from the memory array wafer and comprising:
control logic circuitry; and
additional dielectric material above the control logic circuitry;
bonding the dielectric material of the memory array wafer to the additional dielectric material of the control circuitry wafer to form an assembly;
removing the base structure and portions of the cell pillar structures vertically extending into the base structure to expose the doped semiconductive material; and
forming a source structure from the doped semiconductive material after removing the base structure and the portions of the cell pillar structures, the source structure coupled to the cell pillar structures.

13. The method of claim 12, further comprising:
forming the memory array wafer to further comprise:
digit line contact structures above and in contact with the digit lines; and
bond pads above and in contact with the digit line contact structures, the bond pads extending partially through the dielectric material; and
forming the control circuitry wafer to further comprise additional bond pads extending partially through the additional dielectric material and in electrical communication with the control logic circuitry.

14. The method of claim 13, further comprising bonding the bond pads of the memory array wafer to the additional bond pads of the additional conductive bond pads.

15. The method of claim 12, wherein forming a memory array wafer comprises:
forming a preliminary stack structure above doped epitaxial silicon, the preliminary stack structure comprising sacrificial material vertically interleaved with the insulative material;
forming openings extending through the preliminary stack structure and the doped epitaxial silicon and into the base structure;
annealing the doped epitaxial silicon to form the doped semiconductive material therefrom;
forming the cell pillar structures within the openings;
forming slots extending through the preliminary stack structure;
replacing the sacrificial material with the conductive material after forming the slots to form the stack structure; and
forming the digit lines over the pillar structures after replacing the sacrificial material with the conductive material.

16. The method of claim 12, further comprising:
forming the memory array wafer to further comprise a conductive contact structure horizontally offset from the cell pillar structures and extending completely through the stack structure and partially into the doped semiconductive material; and
forming a contact pad from a portion the doped semiconductive material after removing the base structure and portions of the cell pillar structures, the contact pad coupled to the conductive contact structure.

17. The method of claim 16, wherein forming a contact pad from a portion of the doped semiconductive material comprises forming the contact pad and the source structure from the doped semiconductive material substantially simultaneously, the contact pad electrically isolated from the source structure.

18. A method of forming a microelectronic device, comprising:
forming a first microelectronic device structure comprising:
a preliminary structure overlying a base structure and comprising conductively doped epitaxial silicon;
a stack structure overlying the preliminary structure and comprising conductive structures and insulative structures vertically alternating with the conductive structures;
pillar structures comprising semiconductive material vertically extending through the stack structure and the preliminary structure and into the base structure;
conductive contact structures horizontally offset from the pillar structures and vertically extending through the stack structure and into the preliminary structure; and digit line structures vertically overlying the stack structure and in electrical communication with the pillar structures;

attaching the first microelectronic device structure to a second microelectronic device structure comprising control logic circuitry through a combination of oxide-oxide bonding and metal-metal bonding to form an assembly, the digit line structures of the assembly in electrical communication with the control logic circuitry of the assembly;

after forming the assembly, removing the base structure and portions of the pillar structures to expose the preliminary structure and remaining portions of the pillar structures; and after removing the base structure and the portions of the pillar structures, patterning the preliminary structure to form at least one source structure coupled to the pillar structures and contact pads electrically isolated from the at least one source structure and coupled to the conductive contact structures.

19. The method of claim 18, further comprising:
forming conductive contacts overlying and in electrical communication with the source structure;
forming conductive routing structures over and in electrical communication with the conductive contacts;
additional conductive contacts over and in electrical communication with the conductive routing structures; and
conductive pad structures over and in electrical communication with the additional conductive contacts.

20. The method of claim 19, further comprising forming one or more of at least one metal-insulator-metal (MIM) capacitor and at least one metal-insulator-semiconductor (MIS) capacitor between the source structure and the conductive routing structures.

* * * * *

UNITED STATES PATENT AND TRADEMARK OFFICE
CERTIFICATE OF CORRECTION

PATENT NO. : 11,929,323 B2
APPLICATION NO. : 18/175398
DATED : March 12, 2024
INVENTOR(S) : Kunal R. Parekh It is certified that error appears in the above-identified patent and that said Letters Patent is hereby corrected as shown below:

In the Specification

| | | |
|---|---|---|
| Column 2, | Line 19, | change "the memoir cells" to --the memory cells-- |
| Column 2, | Line 23, | change "conditions(e.g.," to --conditions (e.g.,-- |
| Column 2, | Line 34, | change "memory device," to --memory device.-- |
| Column 5, | Line 42, | change "$HfO_x$, $NbO_X$, $TiO_x$," to --$HfO_x$, $NbO_x$, $TiO_x$,-- |
| Column 7, | Line 31, | change "(256) the tiers" to --(256) of the tiers-- |
| Column 14, | Line 41, | change "glass, $AlO_x$, $HfO_x$," to --glass, AlOx, HfO-- |
| Column 16, | Line 54, | change "pumps, $V_{NEGEL}$ charge pumps," to --pumps, $V_{NEGWL}$ charge pumps,-- |
| Column 21, | Line 42, | change "includes $SiO_x$(e.g.," to --includes $SiO_x$ (e.g.,-- |

Signed and Sealed this
Twenty-eighth Day of May, 2024

Katherine Kelly Vidal
*Director of the United States Patent and Trademark Office*